(12) United States Patent
Kimura et al.

(10) Patent No.: US 12,463,614 B2
(45) Date of Patent: Nov. 4, 2025

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Takashi Yamane, Nagaokakyo (JP); Sho Nagatomo, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 669 days.

(21) Appl. No.: 17/701,975

(22) Filed: Mar. 23, 2022

(65) Prior Publication Data
US 2022/0224305 A1 Jul. 14, 2022

Related U.S. Application Data

(63) Continuation of application No. PCT/JP2020/036395, filed on Sep. 25, 2020.

(30) Foreign Application Priority Data

Sep. 27, 2019 (JP) .................... 2019-178096

(51) Int. Cl.
*H03H 9/02* (2006.01)
*H03H 9/13* (2006.01)
(Continued)

(52) U.S. Cl.
CPC ...... *H03H 9/02015* (2013.01); *H03H 9/0211* (2013.01); *H03H 9/02157* (2013.01);
(Continued)

(58) Field of Classification Search
CPC .......... H03H 9/02; H03H 9/145; H03H 9/25; H03H 9/54; H03H 9/64
See application file for complete search history.

(56) References Cited

U.S. PATENT DOCUMENTS 8,344,589 B2 * 1/2013 Yaoi .................. H03H 9/131
310/313 R
10,374,573 B2 * 8/2019 Bhattacharjee .... H03H 9/02244
(Continued)

FOREIGN PATENT DOCUMENTS

JP 09-266431 A 10/1997
JP 2012-257019 A 12/2012
(Continued)

OTHER PUBLICATIONS

Official Communication issued in International Patent Application No. PCT/JP2020/036395 mailed on Dec. 15, 2020.

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device includes a piezoelectric layer and first and second electrodes facing each other in a direction intersecting a thickness direction of the piezoelectric layer. The acoustic wave device utilizes a bulk wave in a thickness-shear primary mode. A material of the piezoelectric layer is lithium niobate or lithium tantalate. At least a portion of each of the first and second electrodes is embedded in the piezoelectric layer.

14 Claims, 22 Drawing Sheets

(51) Int. Cl.
*H03H 9/205* (2006.01)
*H03H 9/56* (2006.01)

(52) U.S. Cl.
CPC ............ *H03H 9/132* (2013.01); *H03H 9/205* (2013.01); *H03H 9/568* (2013.01)

(56) References Cited

U.S. PATENT DOCUMENTS

| | | | |
|---|---|---|---|
| 10,601,392 B2* | 3/2020 | Plesski | ............... H03H 9/02015 |
| 11,258,427 B2* | 2/2022 | Kadota | ............... H03H 9/02551 |
| 2013/0057360 A1 | 3/2013 | Meltaus et al. | |
| 2016/0182007 A1 | 6/2016 | Bhattacharjee | |
| 2019/0097602 A1 | 3/2019 | Kimura | |

FOREIGN PATENT DOCUMENTS

| | | | |
|---|---|---|---|
| JP | 2013-528996 A | 7/2013 |
| JP | 2018-506930 A | 3/2018 |
| JP | 2019-062441 A | 4/2019 |

\* cited by examiner

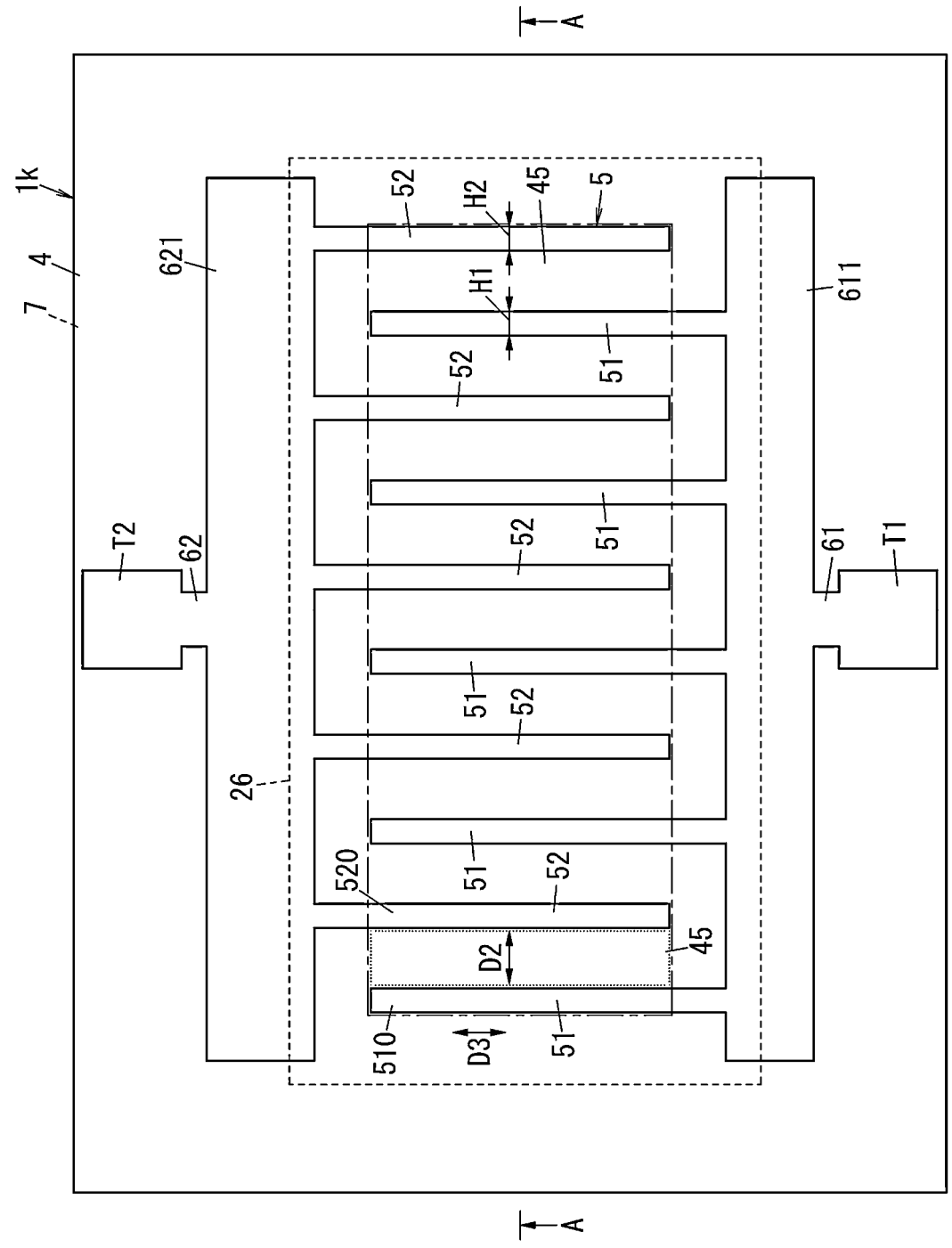

ACOUSTIC WAVE DEVICE

CROSS REFERENCE TO RELATED APPLICATIONS

This application claims the benefit of priority to Japanese Patent Application No. 2019-178096 filed on Sep. 27, 2019 and is a Continuation Application of PCT Application No. PCT/JP2020/036395 filed on Sep. 25, 2020. The entire contents of each application are hereby incorporated herein by reference.

BACKGROUND OF THE INVENTION

1. Field of the Invention

The present invention relates to an acoustic wave device, and more particularly, to an acoustic wave device including a piezoelectric layer.

2. Description of the Related Art

In the past, an acoustic wave device utilizing a plate wave propagating through a piezoelectric film made of $LiNbO_3$ or $LiTaO_3$ has been known. For example, Japanese Unexamined Patent Application Publication No. 2012-257019 discloses an acoustic wave device utilizing a Lamb wave as a plate wave. Here, an IDT electrode is provided on an upper surface of a piezoelectric substrate made of $LiNbO_3$ or $LiTaO_3$. A voltage is applied between a plurality of first electrode fingers and a plurality of second electrode fingers of the IDT electrode. Accordingly, a Lamb wave is excited. A reflector is provided on each side of the IDT electrode. Accordingly, an acoustic wave resonator utilizing a plate wave is configured.

In the acoustic wave device described in Japanese Unexamined Patent Application Publication No. 2012-257019, it is conceivable to decrease the number of the first electrode fingers and the second electrode fingers in order to achieve size reduction. However, when the number of the first electrode fingers and the second electrode fingers is decreased, a Q-value is decreased. In addition, in the acoustic wave device described in Japanese Unexamined Patent Application Publication No. 2012-257019, when the number of the first electrode fingers and the second electrode fingers is decreased in order to achieve size reduction, it has been difficult to increase capacitance of the acoustic wave resonator.

SUMMARY OF THE INVENTION

Preferred embodiments of the present invention provide acoustic wave devices with each of which a Q-value and a capacitance are able to be increased, while achieving size reduction.

An acoustic wave device according to a preferred embodiment of the present invention includes a piezoelectric layer, a first electrode, and a second electrode. The first electrode and the second electrode face each other in a direction intersecting a thickness direction of the piezoelectric layer. In the acoustic wave device, a bulk wave in a thickness-shear primary mode is utilized. A material of the piezoelectric layer is lithium niobate or lithium tantalate. At least a portion of each of the first electrode and the second electrode is embedded in the piezoelectric layer.

An acoustic wave device according to a preferred embodiment of the present invention includes a piezoelectric layer, a first electrode, and a second electrode. The first electrode and the second electrode face each other in a direction intersecting a thickness direction of the piezoelectric layer. The first electrode and the second electrode are electrodes adjacent to each other. In the acoustic wave device, d/p is equal to or less than about 0.5, where in a section along the thickness direction of the piezoelectric layer, when an inter-centerline distance between the first electrode and the second electrode is denoted as p, and a thickness of the piezoelectric layer is denoted as d. A material of the piezoelectric layer is lithium niobate or lithium tantalate. At least a portion of each of the first electrode and the second electrode is embedded in the piezoelectric layer.

An acoustic wave device according to a preferred embodiment of the present invention includes a piezoelectric layer, a first electrode, and a second electrode. The first electrode and the second electrode face each other in a direction intersecting a thickness direction of the piezoelectric layer. In the acoustic wave device, a bulk wave in a thickness-shear primary mode is utilized. The acoustic wave device further includes an acoustic reflection layer. A material of the piezoelectric layer is lithium niobate or lithium tantalate. The piezoelectric layer is on the acoustic reflection layer. At least a portion of each of the first electrode and the second electrode is embedded in the acoustic reflection layer and is in contact with the piezoelectric layer.

An acoustic wave device according to a preferred embodiment of the present invention includes a piezoelectric layer, a first electrode, and a second electrode. The first electrode and the second electrode face each other in a direction intersecting a thickness direction of the piezoelectric layer. In the acoustic wave device, d/p is equal to or less than about 0.5, where in a section along the thickness direction of the piezoelectric layer, an inter-centerline distance between the first electrode and the second electrode is denoted as p, and a thickness of the piezoelectric layer is denoted as d. The acoustic wave device further includes an acoustic reflection layer. A material of the piezoelectric layer is lithium niobate or lithium tantalate. The piezoelectric layer is on the acoustic reflection layer. At least a portion of each of the first electrode and the second electrode is embedded in the acoustic reflection layer and is in contact with the piezoelectric layer.

In each of the acoustic wave devices according to preferred embodiments of the present invention, it is possible to increase a Q-value and a capacitance while achieving size reduction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 25 is a plan view of an acoustic wave device according to Preferred Embodiment 3 of the present invention.

DETAILED DESCRIPTION OF THE PREFERRED EMBODIMENTS

Preferred embodiments of the present invention are described below with reference to the drawings.

FIGS. 1 to 6, 12, and 14 to 28 referred to in the following preferred embodiments and the like are all schematic diagrams, and ratios of sizes and thicknesses of respective components in the diagrams do not necessarily reflect actual dimensional ratios.

Preferred Embodiment 1

Hereinafter, an acoustic wave device 1 according to Preferred Embodiment 1 of the present invention will be described with reference to FIGS. 1 to 3.

(1.1) Overall Configuration of Acoustic Wave Device

Figure 1:
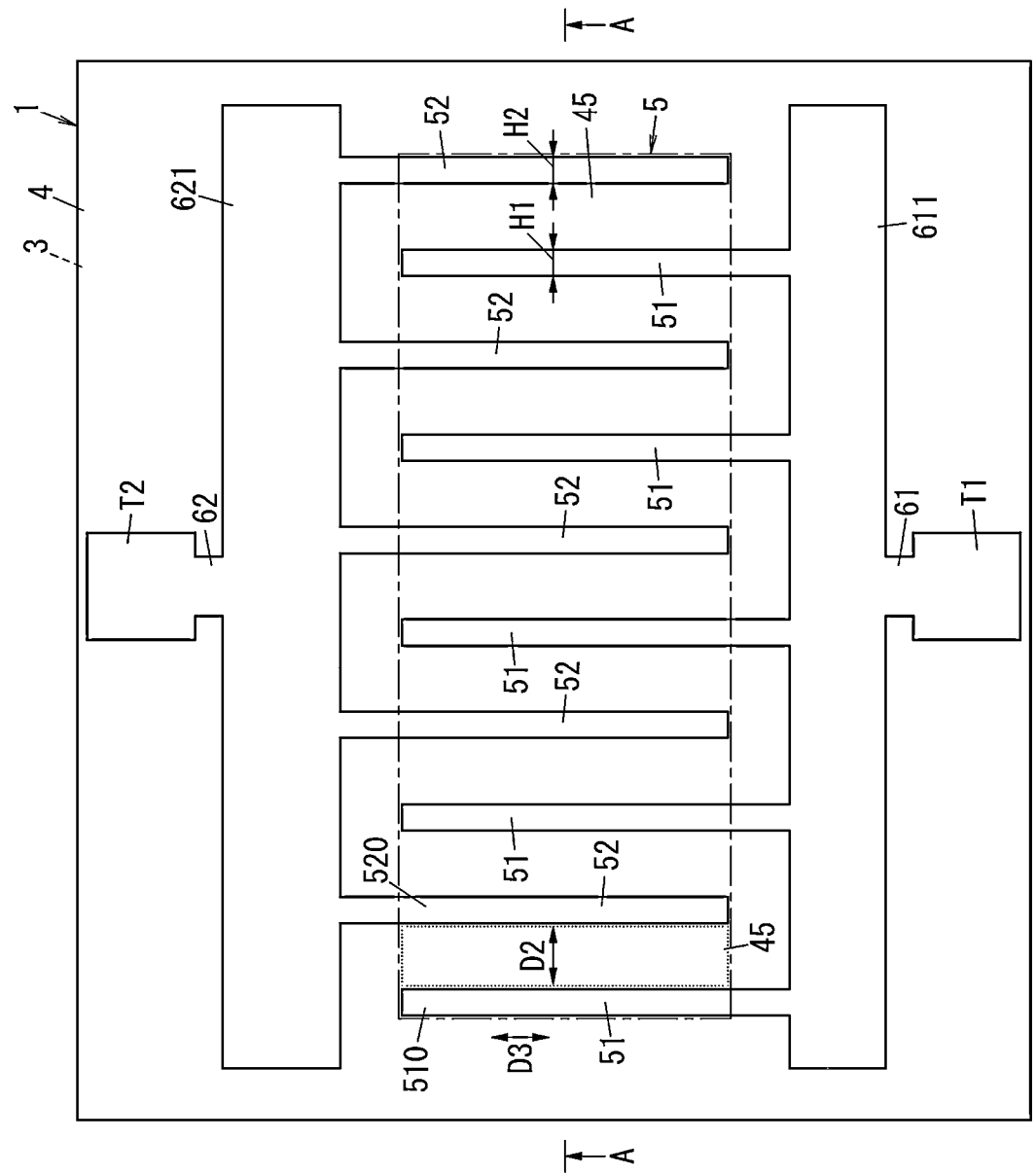
FIG. 1 is a plan view of an acoustic wave device according to Preferred Embodiment 1 of the present invention.

As illustrated in FIG. 1, the acoustic wave device 1 according to Preferred Embodiment 1includes a piezoelectric layer 4, a first electrode 51, and a second electrode 52. As illustrated in FIG. 2, the first electrode 51 and the second electrode 52 face each other in a direction D2 (hereinafter, also referred to as a second direction D2) intersecting a thickness direction D1 (hereinafter, also referred to as a first direction D1) of the piezoelectric layer 4. The acoustic wave device 1 utilizes a bulk wave in a thickness-shear primary mode. The second direction D2 is orthogonal or substantially orthogonal to a polarization direction PZ1 of the piezoelectric layer 4. A bulk wave in the thickness-shear primary mode is a bulk wave whose propagation direction is the thickness direction D1 of the piezoelectric layer 4 due to a thickness-shear vibration of the piezoelectric layer 4 and is a bulk wave in which the number of nodes in the thickness direction D1 of the piezoelectric layer 4 is one. The thickness-shear vibration is excited by the first electrode 51 and the second electrode 52. Thickness-shear vibration is excited in a defined region 45 in the piezoelectric layer 4 between the first electrode 51 and the second electrode 52 in plan view from the thickness direction D1. In the acoustic wave device 1, when the second direction D2 is orthogonal or substantially orthogonal to the polarization direction PZ1 of the piezoelectric layer 4, an electromechanical coupling coefficient (hereinafter, also referred to as a coupling coefficient) of a bulk wave in the thickness-shear primary mode is large. Here, "orthogonal" is not limited to a case of being strictly orthogonal and may also refer to substantially orthogonal (an angle formed by the second direction D2 and the polarization direction PZ1 is, for example, about 90°±10°).

Figure 2:
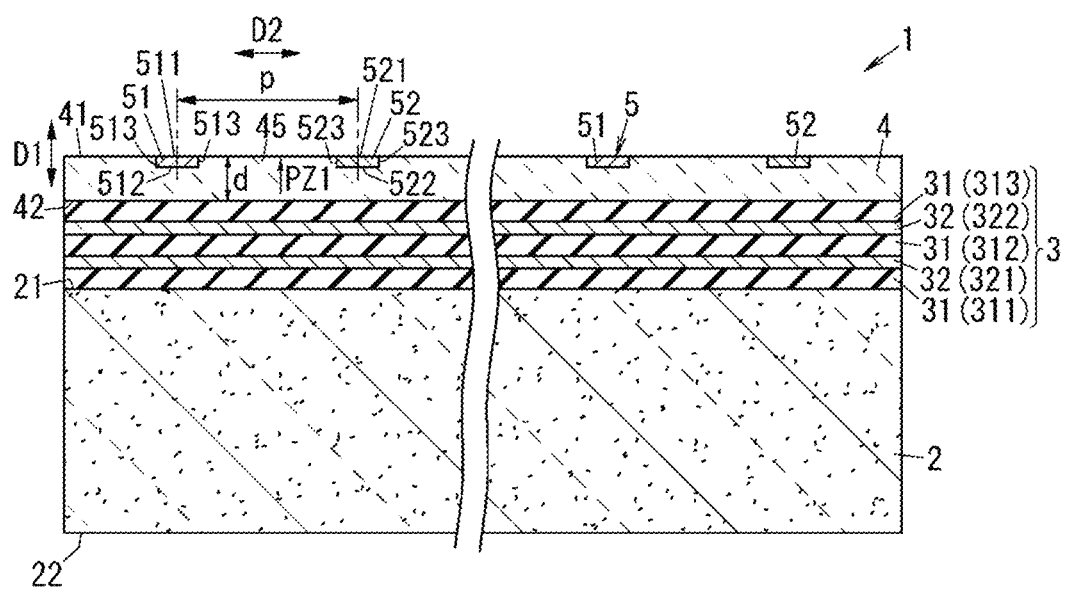
FIG. 2 is a sectional view taken along a line A-A of FIG. 1 and related to the acoustic wave device according to Preferred Embodiment 1 of the present invention.
Figure 3:
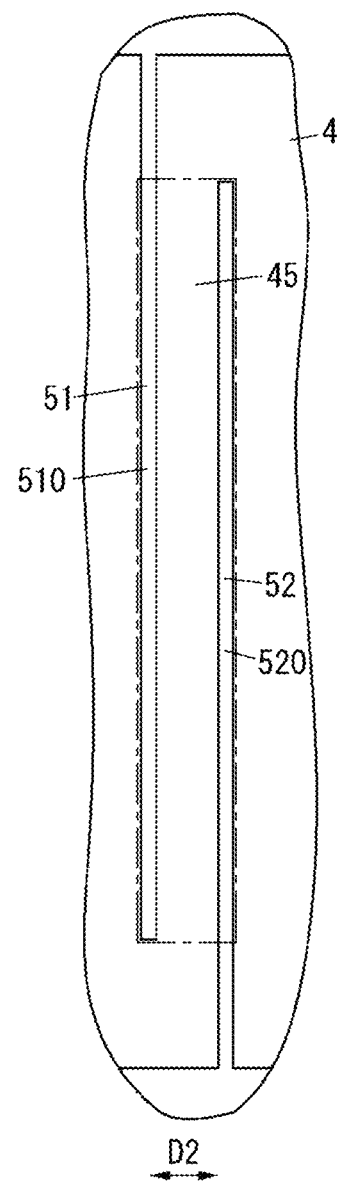
FIG. 3 is a plan view of a main portion of the acoustic wave device according to Preferred Embodiment 1 of the present invention.

As illustrated in FIGS. 1 and 2, the first electrode 51 and the second electrode 52 intersect each other when viewed from the second direction D2. "Intersect each other when viewed from the second direction D2" means mutual overlapping when viewed from the second direction D2. The acoustic wave device 1 further includes a first wiring portion 61 connected to the first electrode 51 and a second wiring portion 62 connected to the second electrode 52. The first wiring portion 61 is connected to a first terminal T1. The second wiring portion 62 is connected to a second terminal T2 different from the first terminal T1. The acoustic wave device 1 includes a plurality of first electrodes 51 and a plurality of second electrodes 52. That is, when the first electrode 51 and the second electrode 52 define a pair of electrodes, the acoustic wave device 1 includes a plurality of pairs of the electrodes. In the acoustic wave device 1, the first electrodes 51 and the second electrodes 52 are alternately provided in the second direction D2 one by one. In the acoustic wave device 1, as illustrated in FIG. 1, the plurality of first electrodes 51 are connected to the one first wiring portion 61, and the plurality of second electrodes 52 are connected to the one second wiring portion 62.

As illustrated in FIG. 2, the acoustic wave device 1 includes a support substrate 2, an acoustic reflection layer 3, the piezoelectric layer 4, the first electrode 51, and the second electrode 52. The acoustic reflection layer 3 is provided on the support substrate 2. The piezoelectric layer 4 is provided on the acoustic reflection layer 3. The first electrode 51 and the second electrode 52 are in contact with the piezoelectric layer 4. The acoustic reflection layer 3 includes at least one (for example, two) high acoustic impedance layer 32 and at least one (for example, three) low acoustic impedance layer 31. The low acoustic impedance layer 31 has an acoustic impedance lower than that of the high acoustic impedance layer 32. The acoustic wave device 1 includes, as a resonator, an acoustic wave resonator 5 including the first electrode 51, the second electrode 52, and the piezoelectric layer 4 described above. In the acoustic wave device 1, the acoustic wave resonator 5 further includes the acoustic reflection layer 3 described above.

(1.2) Each Component of Acoustic Wave Device

Next, each component of the acoustic wave device 1 will be described with reference to the drawings.

(1.2.1) Support Substrate

As illustrated in FIG. 2, the support substrate 2 supports the piezoelectric layer 4. In the acoustic wave device 1 according to Preferred Embodiment 1, the support substrate 2 also supports the acoustic reflection layer 3 and supports the piezoelectric layer 4 and the first electrode 51 and the second electrode 52 via the acoustic reflection layer 3.

The support substrate 2 includes a first main surface 21 and a second main surface 22 facing each other. The first main surface 21 and the second main surface 22 face each other in a thickness direction of the support substrate 2. The thickness direction of the support substrate 2 is a direction along the thickness direction D1 of the piezoelectric layer 4. In plan view from the thickness direction D1 of the piezoelectric layer 4, an outer peripheral shape of the support substrate 2 is a rectangular or substantially rectangular shape but is not limited thereto and may be, for example, a square or substantially square shape.

The support substrate 2 is, for example, a silicon substrate. A thickness of the support substrate 2 is, for example, about 120 μm but is not limited thereto. The silicon substrate is, for example, a single crystal silicon substrate. When the support substrate 2 is a silicon substrate, as a plane orientation of the first main surface 21, for example, a (100) plane, a (110) plane, or a (111) plane may be used. A propagation orientation of the bulk wave described above can be set without being restricted by the plane orientation of the silicon substrate. Resistivity of the silicon substrate is, for example, equal to or greater than about 1 kΩcm, preferably equal to or greater than about 2 kΩcm, and more preferably equal to or greater than about 4 kΩcm.

The support substrate 2 is not limited to a silicon substrate and may be, for example, a quartz substrate, a glass substrate, a sapphire substrate, a lithium tantalate substrate, a lithium niobate substrate, an alumina substrate, a spinel substrate, a gallium arsenide substrate, or a silicon carbide substrate.

(1.2.2) Acoustic Reflection Layer

As illustrated in FIG. 2, the acoustic reflection layer 3 is provided on the first main surface 21 of the support substrate 2. The acoustic reflection layer 3 faces the first electrode 51 and the second electrode 52 in the thickness direction D1 of the piezoelectric layer 4.

The acoustic reflection layer 3 reduces or prevents leakage of a bulk wave (bulk wave in the above-described thickness-shear primary mode) excited by the first electrode 51 and the second electrode 52 to the support substrate 2. Since the acoustic wave device 1 includes the acoustic reflection layer 3, an effect of confining acoustic wave energy inside the piezoelectric layer 4 can be improved. Thus, the acoustic wave device 1 can reduce a loss and increase a Q-value, as compared with a case where the acoustic reflection layer 3 is not included.

The acoustic reflection layer 3 has a laminated structure including (for example, three) low acoustic impedance layers 31 and (for example, two) high acoustic impedance layers 32 are alternately arranged one by one in the thickness direction D1 of the piezoelectric layer 4. An acoustic impedance of the low acoustic impedance layer 31 is lower than an acoustic impedance of the high acoustic impedance layer 32.

Hereinafter, for convenience of description, in the acoustic reflection layer 3, the two high acoustic impedance layers 32 may be referred to as a first high acoustic impedance layer 321 and a second high acoustic impedance layer 322 in order of closeness to the first main surface 21 of the support substrate 2. Further, the three low acoustic impedance layers 31 may be referred to as a first low acoustic impedance layer 311, a second low acoustic impedance layer 312, and a third low acoustic impedance layer 313 in order of closeness to the first main surface 21 of the support substrate 2.

In the acoustic reflection layer 3, the first low acoustic impedance layer 311, the first high acoustic impedance layer 321, the second low acoustic impedance layer 312, the second high acoustic impedance layer 322, and the third low acoustic impedance layer 313 are provided in this order from a side of the support substrate 2. Thus, the acoustic reflection layer 3 can reflect a bulk wave (bulk wave in the thickness-shear primary mode) from the piezoelectric layer 4 at each of an interface between the third low acoustic impedance layer 313 and the second high acoustic impedance layer 322, an interface between the second high acoustic impedance layer 322 and the second low acoustic impedance layer 312, an interface between the second low acoustic impedance layer 312 and the first high acoustic impedance layer 321, and an interface between the first high acoustic impedance layer 321 and the first low acoustic impedance layer 311.

A material of the high acoustic impedance layers 32 is, for example, Pt (platinum). Further, a material of the low acoustic impedance layers 31 is, for example, silicon oxide. A thickness of each of the high acoustic impedance layers 32 is, for example, about 94 nm. Further, a thickness of each of the low acoustic impedance layers 31 is, for example, about 188 nm. Since each of the two high acoustic impedance layers 32 is made of platinum, the acoustic reflection layer 3 includes two conductive layers.

The material of the high acoustic impedance layers 32 is not limited to Pt and may be, for example, a metal such as W (tungsten) or Ta (tantalum). In addition, the material of the high acoustic impedance layers 32 is not limited to metal and may be, for example, an insulator.

Further, the high acoustic impedance layers 32 are not limited to being made of the same material and, for example, may be made of materials different from each other. Further, the low acoustic impedance layers 31 are not limited to being made of the same material and, for example, may be made of materials different from each other.

Further, in the acoustic reflection layer 3, the number of the high acoustic impedance layers 32 is not limited to two and may be three or more, and the number of the low acoustic impedance layers 31 is not limited to three and may be four or more. In addition, the number of the high acoustic impedance layers 32 and the number of the low acoustic impedance layers 31 are not limited to being different and may be the same, or the number of the low acoustic impedance layers 31 may be one less than the number of the high acoustic impedance layers 32. In addition, the thickness of each of the high acoustic impedance layer 32 and the low acoustic impedance layer 31 is appropriately set according to a desired frequency of the acoustic wave device 1 and a material applied to each of the high acoustic impedance layer 32 and the low acoustic impedance layer 31 so that favorable reflection is obtained in the acoustic reflection layer 3.

(1.2.3) Piezoelectric Layer

As illustrated in FIG. 2, the piezoelectric layer 4 includes a first main surface 41 and a second main surface 42 that face each other. The first main surface 41 and the second main surface 42 face each other in the thickness direction D1 of the piezoelectric layer 4. In the piezoelectric layer 4, of the first main surface 41 and the second main surface 42, the first main surface 41 is located on a side of the first electrode 51 and the second electrode 52, and the second main surface 42 is located on a side of the acoustic reflection layer 3. Thus, in the acoustic wave device 1, a distance between the first main surface 41 of the piezoelectric layer 4 and the acoustic reflection layer 3 is longer than a distance between the second main surface 42 of the piezoelectric layer 4 and the acoustic reflection layer 3. A material of the piezoelectric layer 4 is, for example, lithium niobate ($LiNbO_3$) or lithium tantalate ($LiTaO_3$). The piezoelectric layer 4 is, for example, a Z-cut $LiNbO_3$ or a Z-cut $LiTaO_3$. With respect to Euler angles ($\varphi$, $\theta$, $\psi$) of the piezoelectric layer 4, $\varphi$ is about $0°\pm10°$, and $\theta$ is about $0°\pm10°$. $\psi$ is any angle. From a viewpoint of increasing a coupling coefficient, the piezoelectric layer 4 is preferably a Z-cut $LiNbO_3$ or a Z-cut $LiTaO_3$, for example. The piezoelectric layer 4 may be a rotated Y-cut $LiNbO_3$, a rotated Y-cut $LiTaO_3$, an X-cut $LiNbO_3$, or an X-cut $LiTaO_3$. A propagation orientation may be a Y-axis direction, may be an X-axis direction, or may be a direction rotated within a range of about $\pm90°$ from an X-axis in crystal axes (X, Y, Z) defined for a crystal structure of the piezoelectric layer 4. The piezoelectric layer 4 is a single crystal but is not limited thereto or may be, for example, a twin crystal or ceramics.

A thickness of the piezoelectric layer 4 is, for example, equal to or greater than about 50 nm and equal to or less than about 1000 nm and is, for example, about 400 nm.

The piezoelectric layer 4 includes the defined region 45. The defined region 45 is a region in the piezoelectric layer that intersects both the first electrode 51 and the second electrode 52 in a direction in which the first electrode 51 and the second electrode 52 face each other and that is located between the first electrode 51 and the second electrode 52, in plan view from the thickness direction D1 of the piezoelectric layer 4.

(1.2.4) Electrode

In the acoustic wave device 1, for example, of the first electrode 51 and the second electrode 52, the first electrode is a hot electrode, and the second electrode is a ground electrode. In the acoustic wave device 1, the first electrodes 51 and the second electrodes 52 are alternately provided one by one so as to be separated from each other. Thus, the first electrode 51 and the second electrode 52 adjacent to each other are separated from each other. An inter-centerline distance between the first electrode 51 and the second electrode 52 adjacent to each other is, for example, equal to or greater than about 1 μm and equal to or less than about 10 μm and is, for example, about 3 μm. Here, the case where the first electrode 51 and the second electrode 52 are "adjacent to each other" refers to a case where there is no electrode connected to a hot electrode or a ground electrode, including the other first electrode 51 and second electrode 52, between the first electrode 51 and the second electrode 52. A group of electrodes including the plurality of first electrodes 51 and the plurality of second electrodes 52 only needs to have a configuration in which the first electrodes 51 and the second electrodes 52 are separated from each other in the second direction D2 and may have a configuration in which the first electrodes 51 and the second electrodes 52 are not alternately provided so as to be separated from each other. For example, a region in which the first electrodes 51 and the second electrodes 52 are provided one by one so as to be spaced apart from each other and a region in which two of the first electrodes 51 or the second electrodes 52 are provided in the second direction D2 may be mixed.

The first electrodes 51 and the second electrodes 52 each have an elongated shape (linear shape) in plan view from the thickness direction D1 of the piezoelectric layer 4, with a third direction D3 orthogonal or substantially orthogonal to the second direction D2 as a longitudinal direction and the second direction D2 as a width direction, as illustrated in FIG. 1. A length of each of the first electrodes 51 is, for example, about 20 μm but is not limited thereto. A width H1 (first electrode width H1) of each of the first electrodes 51 is, for example, in the range from about 50 nm to about 1000 nm and is, for example, about 500 nm. A length of each of the second electrodes 52 is, for example, about 20 μm but is not limited thereto. A width H2 (second electrode width H2) of each of the second electrodes 52 is, for example, in the range from about 50 nm to about 1000 nm and is, for example, about 500 nm.

The first electrode 51 includes a first electrode main portion 510. The first electrode main portion 510 intersects the second electrode 52 in the direction in which the first electrode and the second electrode 52 face each other. Further, the second electrode 52 includes a second electrode main portion 520. The second electrode main portion 520 intersects the first electrode 51 in the direction in which the first electrode 51 and the second electrode 52 face each other.

In the acoustic wave device 1 according to Preferred Embodiment 1, the first electrodes 51 have the same or substantially the same first electrode width H1 but are not limited thereto. In addition, in the acoustic wave device 1 according to Preferred Embodiment 1, the second electrodes 52 have the same or substantially the same second electrode width H2 but are not limited thereto. In the acoustic wave device 1 according to Preferred Embodiment 1, the first electrode width H1 and the second electrode width H2 are the same or substantially the same but are not limited thereto, and the first electrode width H1 and the second electrode width H2 may be different from each other.

With respect to the acoustic wave device 1 according to Preferred Embodiment 1, although FIG. 1 is shown with the number of each of the first electrodes 51 and the second electrodes 52 as five, for example, the number of each of first electrodes 51 and second electrodes 52 is not limited to five and may be, for example, one, two to four, six or more, or fifty or more.

The second direction D2 in which the adjacent first electrode 51 and second electrode 52 face each other is preferably orthogonal or substantially orthogonal to the polarization direction PZ1 (see FIG. 2) of the piezoelectric layer 4 but is not limited thereto. For example, when the piezoelectric layer 4 is not a Z-cut piezoelectric body, the first electrode 51 and the second electrode 52 may face each other in a direction orthogonal or substantially orthogonal to the third direction D3 which is the longitudinal direction. Note that, both the first electrode 51 and the second electrode 52 are not rectangular or substantially rectangular, in some cases. In this case, the third direction D3, which is the longitudinal direction, may be a long side direction of a circumscribed polygon circumscribing the first electrode 51 and the second electrode 52 in plan view of the first electrode 51 and the second electrode 52. Note that, when the first wiring portion 61 is connected to the first electrode 51 and the second wiring portion 62 is connected to the second electrode 52, the "circumscribed polygon circumscribing the first electrode 51 and the second electrode 52" at least includes a polygon circumscribing a portion of the first electrode 51 excluding a portion connected to the first wiring portion 61 and a portion of the second electrode 52 excluding a portion connected to the second wiring portion 62.

In the acoustic wave device 1, as illustrated in FIG. 2, at least a portion of each of the first electrodes 51 is embedded in the piezoelectric layer 4. In addition, in the acoustic wave device 1, at least a portion of each of the second electrodes 52 is embedded in the piezoelectric layer 4.

In the acoustic wave device 1 according to Preferred Embodiment 1, a thickness of each of the first electrodes 51 is less than the thickness of the piezoelectric layer 4. Each of the first electrodes 51 includes a first main surface 511 and a second main surface 512 intersecting the thickness direction D1 of the piezoelectric layer 4, and two side surfaces 513 and 513 intersecting the width direction of the first electrode 51. In each of the first electrodes 51, of the first main surface 511 and the second main surface 512, the second main surface 512 is located on a side of the acoustic reflection layer 3. Thus, in the acoustic wave device 1, a shortest distance between the first main surface 511 of the first electrode 51 and the acoustic reflection layer 3 is greater than a shortest distance between the second main surface 512 of the first electrode 51 and the acoustic reflection layer 3. In each of the first electrodes 51, the second main surface 512 and the two side surfaces 513 and 513 are in planar contact with the piezoelectric layer 4.

In the acoustic wave device 1 according to Preferred Embodiment 1, a thickness of each of the second electrodes 52 is less than the thickness of the piezoelectric layer 4. Each of the second electrodes 52 includes a first main surface 521 and a second main surface 522 intersecting the thickness direction D1 of the piezoelectric layer 4, and two side surfaces 523 and 523 intersecting the width direction of the second electrode 52. In each of the second electrodes 52, of the first main surface 521 and the second main surface 522, the second main surface 522 is located on the side of the acoustic reflection layer 3. Thus, in the acoustic wave device 1, a shortest distance between the first main surface 521 of the second electrode 52 and the acoustic reflection layer 3 is greater than a shortest distance between the second main surface 522 of the second electrode 52 and the acoustic reflection layer 3. In each of the second electrodes 52, the second main surface 522 and the two side surfaces 523 and 523 are in planar contact with the piezoelectric layer 4.

In the acoustic wave device 1, a portion of the piezoelectric layer 4 is interposed between the side surface 513 of the first electrode 51 and the side surface 523 of the second electrode 52 that face each other, in the second direction D2. In each of the first electrodes 51, the side surface 513 facing the second electrode 52 in the second direction D2 is in contact with the piezoelectric layer 4. In each of the second electrodes 52, the side surface 523 facing the first electrode 51 in the second direction D2 is in contact with the piezoelectric layer 4.

In the acoustic wave device 1 according to Preferred Embodiment 1, the first main surfaces 511 of the respective first electrodes 51 are flush with the first main surface 41 of the piezoelectric layer 4 but are not limited thereto. In the acoustic wave device 1 according to Preferred Embodiment 1, the first main surfaces 521 of the respective second electrodes 52 are flush with the first main surface 41 of the piezoelectric layer 4 but are not limited thereto.

The plurality of first electrodes 51 and the plurality of second electrodes 52 are electrically conductive. A material of the first electrode 51 and the second electrode 52 is, for example, Al (aluminum), Cu (copper), Pt (platinum), Au (gold), Ag (silver), Ti (titanium), Ni (nickel), Cr (chromium), Mo (molybdenum), W (tungsten), alloys including any of these metals as a main component, or the like. Further, the first electrode 51 and the second electrode 52 may each have a structure in which metal films made of these metals or alloys are laminated. Each of the first electrode 51 and the second electrode 52 includes, for example, a laminated film including an adhesion film made of a Ti film and a main electrode film made of an Al film or an AlCu film formed on the adhesion film. A thickness of the adhesion film is, for example, about 10 nm. Further, a thickness of the main electrode film is, for example, about 80 nm. In the AlCu film, Cu concentration is preferably from about 1 wt % to about 20 wt %, for example.

(1.2.5) First Wiring Portion and Second Wiring Portion

The first wiring portion 61 includes a first busbar 611. The first busbar 611 is a conductor portion making the first electrodes 51 have the same potential. The first busbar 611 has an elongated shape (linear shape) with the second direction D2 as a longitudinal direction. The first electrodes 51 connected to the first busbar 611 extend toward a second busbar 621. In the acoustic wave device 1, a first conductor portion including the plurality of first electrodes 51 and the first busbar 611 has a comb shape in plan view from the thickness direction D1 of the piezoelectric layer 4. The first busbar 611 is integrally provided with the plurality of first electrodes 51 but is not limited thereto. Similar to the plurality of first electrodes 51, at least a portion of the first busbar 611 is embedded in the piezoelectric layer 4 but is not limited thereto. A location of the first busbar 611 in the thickness direction D1 of the piezoelectric layer 4 is not particularly limited.

The second wiring portion 62 includes the second busbar 621. The second busbar 621 is a conductor portion making the second electrodes 52 have the same potential. The second busbar 621 has an elongated shape (linear shape) with the second direction D2 as a longitudinal direction. The second electrodes 52 connected to the second busbar 621 extend toward the first busbar 611. In the acoustic wave device 1, a second conductor portion including the plurality of second electrodes 52 and the second busbar 621 has a comb-like shape in plan view from the thickness direction D1 of the piezoelectric layer 4. The second busbar 621 is integrally provided with the plurality of second electrodes 52 but is not limited thereto. Similar to the plurality of second electrodes 52, at least a portion of the second busbar 621 is embedded in the piezoelectric layer 4 but is not limited thereto. A location of the second busbar 621 in the thickness direction D1 of the piezoelectric layer 4 is not particularly limited.

The first busbar 611 and the second busbar 621 face each other in the third direction D3.

The first wiring portion 61 and the second wiring portion 62 are electrically conductive. A material of the first wiring portion 61 and the second wiring portion 62 is, for example, Al, Cu, Pt, Au, Ag, Ti, Ni, Cr, Mo, W, an alloy including any of these metals as a main component, or the like. Further, the first wiring portion 61 and the second wiring portion 62 may each have a structure in which metal films made of these metals or alloys are laminated. Each of the first wiring portion 61 and the second wiring portion 62 includes, for example, a laminated film including an adhesion film made of a Ti film and a main wiring film made of an Al film or an AlCu film provided on the adhesion film. A thickness of the adhesion film is, for example, about 10 nm. Further, a thickness of the main wiring film is, for example, about 80 nm. In the AlCu film, Cu concentration is preferably, for example, from about 1 wt % to about 20 wt %.

In the acoustic wave device 1, from a viewpoint of reducing resistance of the first busbar 611 and the second busbar 621, each of the first busbar 611 and the second busbar 621 may include a metal film on the main wiring film.

(1.3) Method of Manufacturing Acoustic Wave Device

In a non-limiting example of a method of manufacturing the acoustic wave device 1, for example, a first step to a fourth step are performed after the support substrate 2 is prepared. In the first step, the acoustic reflection layer 3 is formed on the first main surface 21 of the support substrate 2. In the second step, a piezoelectric substrate, from which the piezoelectric layer 4 is formed, and the support substrate 2 are bonded to each other with the acoustic reflection layer 3 interposed therebetween. In the third step, by thinning the piezoelectric substrate, the piezoelectric layer 4 formed from a portion of the piezoelectric substrate is formed. In the fourth step, the first electrode 51, the second electrode 52, the first wiring portion 61, the second wiring portion 62, the first terminal T1, and the second terminal T2 are formed by utilizing, for example, a photolithography technique, an etching technique, a thin film forming technique, or the like. In addition, in the first step to the fourth step, a silicon wafer is used as the support substrate 2, and a piezoelectric wafer is used as the piezoelectric substrate. In the above-described method of manufacturing the acoustic wave device 1, a wafer including a plurality of acoustic wave devices 1 is diced to obtain a plurality of acoustic wave devices 1 (chips).

The method of manufacturing the acoustic wave device 1 is an example and is not particularly limited. For example, the piezoelectric layer 4 may be formed by utilizing a film forming technique. In this case, the method of manufacturing the acoustic wave device 1 includes a step of forming the piezoelectric layer 4, instead of the second step and the third step. The piezoelectric layer 4 formed by the film forming technique may be, for example, a single crystal or a twin crystal. Examples of the film forming technique include, but are not limited to, a CVD (Chemical Vapor Deposition) method, for example.

(1.4) Operation and Characteristics of Acoustic Wave Device

Figure 4:
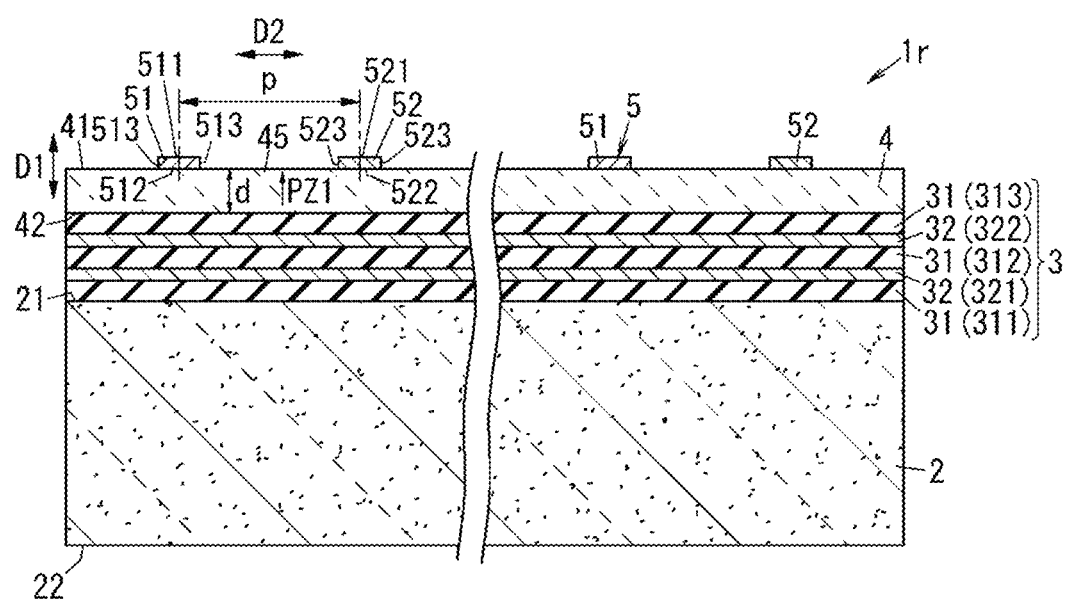
FIG. 4 is a sectional view of an acoustic wave device according to Reference Preferred Embodiment 1 of the present invention.

First, an acoustic wave device 1r according to Reference Preferred Embodiment 1 of the present invention utilizing a bulk wave in a thickness-shear primary mode will be described with reference to FIGS. 4, 5B, and 6. In the acoustic wave device 1r according to Reference Preferred Embodiment 1, the same or similar components to those of the acoustic wave device 1 according to Preferred Embodiment 1 are denoted by the same reference numerals, and a description thereof is omitted.

The acoustic wave device 1r according to Reference Preferred Embodiment 1 differs from the acoustic wave device 1 according to Preferred Embodiment 1 in that the acoustic wave device 1r is provided on the first main surface 41 of the piezoelectric layer 4. That is, the acoustic wave device 1r according to Reference Preferred Embodiment 1 differs from the acoustic wave device 1 according to Preferred Embodiment 1 in that the plurality of first electrodes 51 and the plurality second electrodes 52 are not embedded in the piezoelectric layer 4.

As with the acoustic wave device 1 according to Preferred Embodiment 1, the acoustic wave device 1r according to Reference Preferred Embodiment 1 is an acoustic wave device that utilizes a bulk wave in the thickness-shear primary mode. As described above, a bulk wave in the thickness-shear primary mode is a bulk wave whose propagation direction is the thickness direction D1 of the piezoelectric layer 4 due to a thickness-shear vibration of the piezoelectric layer 4 and is a bulk wave in which the number of nodes in the thickness direction D1 of the piezoelectric layer 4 is one. The thickness-shear vibration is excited by the first electrode 51 and the second electrode 52. The thickness-shear vibration is excited in the defined region 45 in the piezoelectric layer 4 between the first electrode 51 and the second electrode 52 in plan view from the thickness direction D1. The thickness-shear vibration can be confirmed by, for example, an FEM (Finite Element Method). More specifically, the thickness-shear vibration can be confirmed by analyzing a displacement distribution by the FEM and analyzing deformation by using, for example, parameters of the piezoelectric layer 4 (the material, the Euler angles, the thickness, and the like), parameters of the first electrode 51 and the second electrode 52 (the material, the thickness, the inter-centerline distance between the first electrode 51 and the second electrode 52, and the like), and parameters of the acoustic reflection layer 3 (the material, the thickness, and the like). The Euler angles of the piezoelectric layer 4 can be obtained by analysis.

A difference between a Lamb wave utilized in an existing acoustic wave device and a bulk wave in the thickness-shear primary mode will be described with reference to FIGS. 5A and 5B.

Figure 5A:
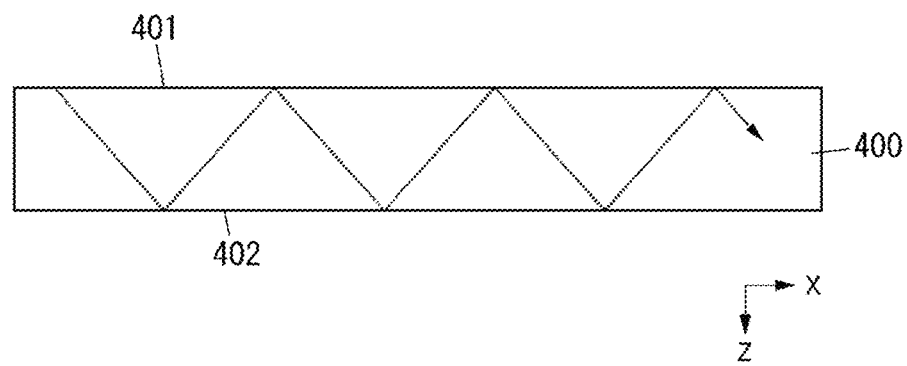
FIG. 5A is an explanatory diagram of a Lamb wave.

FIG. 5A is a schematic elevational sectional view for explaining a Lamb wave propagating through a piezoelectric substrate of an acoustic wave device as described in Japanese Unexamined Patent Application Publication No. 2012-257019. In this acoustic wave device, an acoustic wave propagates through a piezoelectric substrate 400 as indicated by an arrow. Here, the piezoelectric substrate 400 includes a first main surface 401 and a second main surface 402 facing each other. In FIG. 5A, a Z direction and an X direction are illustrated separately from the piezoelectric substrate 400. In FIG. 5A, the Z direction is a thickness direction of the piezoelectric substrate 400 in which the first main surface 401 and the second main surface 402 are connected. The X direction is a direction in which a plurality of first electrode fingers and a plurality of second electrode fingers of an IDT electrode are provided. The Lamb wave is a plate wave in which an acoustic wave propagates in the X direction as illustrated in FIG. 5A. Thus, in the existing acoustic wave device, since the acoustic wave propagates in the X direction, two reflectors are disposed on respective sides of the IDT electrode to obtain desired resonance characteristics. Thus, in the existing acoustic wave device, a propagation loss of the acoustic wave occurs, and thus, when size reduction is desired, that is, when the number of pairs of the first electrode finger and the second electrode finger is reduced, a Q-value is reduced.

Figure 5B:
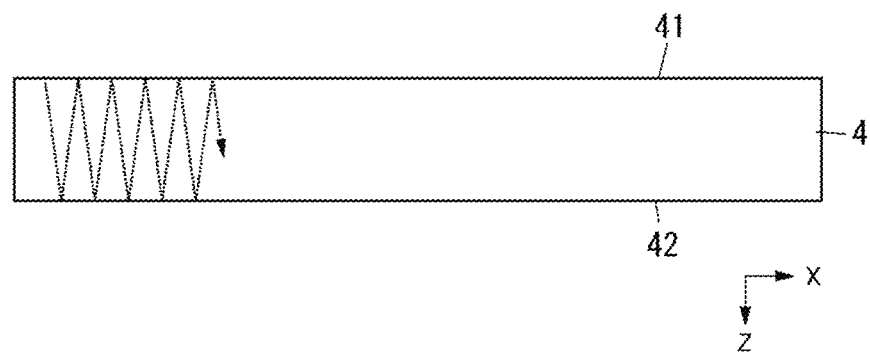
FIG. 5B is an explanatory diagram of a bulk wave in a thickness-shear primary mode.

On the other hand, in the acoustic wave device 1r according to Reference Preferred Embodiment 1, since a vibration is displaced in a thickness-shear direction, the acoustic wave propagates in or substantially in a direction in which the first main surface 41 and the second main surface 42 of the piezoelectric layer 4 are connected, that is, in or substantially in the Z direction and resonates, as illustrated in FIG. 5B. That is, an X-direction component of the acoustic wave is significantly less than a Z-direction component. In the acoustic wave device 1r according to Reference Preferred Embodiment 1, since resonance characteristics are obtained by propagation of the acoustic wave in the Z direction, a reflector is not necessary. Thus, in the acoustic wave device 1r according to Reference Preferred Embodiment 1, no propagation loss occurs when an acoustic wave propagates to the reflector. Thus, in the acoustic wave device 1r according to Reference Preferred Embodiment 1, even when the number of electrode pairs each including the first electrode 51 and the second electrode 52 is reduced to achieve size reduction, a decrease in the Q-value is less likely to occur.

Figure 6:
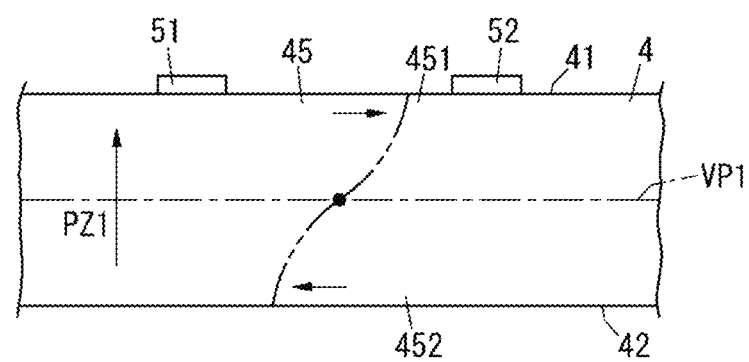
FIG. 6 is an operation explanatory diagram of the acoustic wave device according to Preferred Embodiment 1 of the present invention.

In the acoustic wave device 1r according to the reference preferred embodiment, as illustrated in FIG. 6, an amplitude direction of a bulk wave in the thickness-shear primary mode is inverted between a first region 451 included in the defined region 45 of the piezoelectric layer 4, and a second region 452 included in the defined region 45. In FIG. 6, a bulk wave is schematically illustrated by a two-dot chain line when a voltage is applied between the first electrode 51 and the second electrode 52 such that the second electrode 52 is higher than the first electrode 51 in potential. The first region 451 is a portion, of the defined region 45, between a virtual plane VP1 and the first main surface 41, the virtual plane VP1 being orthogonal or substantially orthogonal to the thickness direction D1 of the piezoelectric layer 4 and dividing the piezoelectric layer 4 into two. The second region 452 is a portion of the defined region 45 between the virtual plane VP1 and the second main surface 42.

Hereinafter, a result of a characteristic simulation performed on a structural model of an acoustic wave device of Reference Preferred Embodiment 2 utilizing a bulk wave in a thickness-shear primary mode will be described. With respect to the structural model, the same or similar components to those of the acoustic wave device 1r according to Reference Preferred Embodiment 1 will be denoted by the same reference numerals, and described. The structural model differs from that of the acoustic wave device 1r according to Reference Preferred Embodiment 1 in that the acoustic reflection layer 3 is not provided. In the simulation, the number of pairs of the first electrode 51 and the second electrode 52 was assumed to be infinite, and the piezoelectric layer 4 was a 120° rotated Y-cut X-propagation $LiNbO_3$. In the structural model, the piezoelectric layer 4 is a membrane, and the second main surface 42 of the piezoelectric layer 4 is in contact with air. The structural model will be described in which, in a section (FIG. 6) along the thickness direction D1 of the piezoelectric layer 4, an inter-centerline distance between the first electrode 51 and the second electrode 52 is denoted as p, and a thickness of the piezoelectric layer 4 is denoted as d. In addition, in plan view from the thickness direction D1 of the piezoelectric layer 4, an area of the first electrode main portion 510 is denoted as S1, an area of the second electrode main portion 520 is denotes as S2, an area of the defined region 45 is denoted as S0, and a structural parameter defined by $(S1+S2)/(S1+S2+S0)$ is denoted as MR. Note that, when at least one of the first electrode 51 and the second electrode 52 is plurally provided on the piezoelectric layer 4 (in other words, when the first electrodes 51 and the second electrodes 52 define a pair of electrode sets, and, for example, 1.5 or more pairs of the electrode sets are provided on the piezoelectric layer 4), the above inter-centerline distance p is each inter-centerline distance between the adjacent first electrodes 51 and second electrodes 52.

Figure 7A:
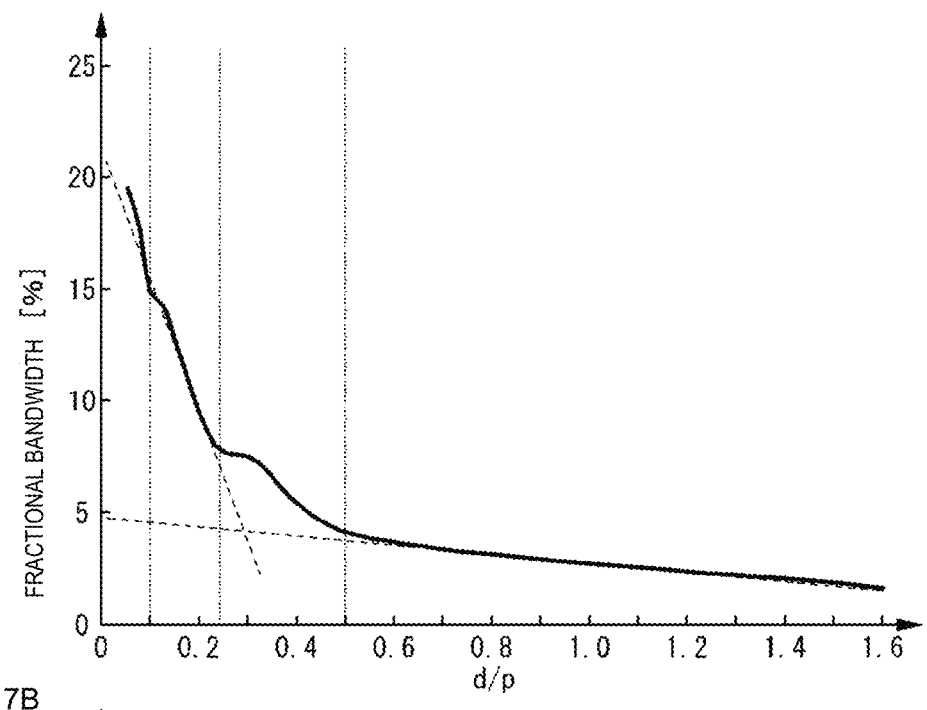
FIG. 7A is a graph showing a relationship between fractional bandwidth in a thickness-shear mode and [thicknesses of piezoelectric layer]/[inter-centerline distance between first electrode and second electrode], for a structural model of an acoustic wave device according to Reference Preferred Embodiment of the present invention.
Figure 7B:
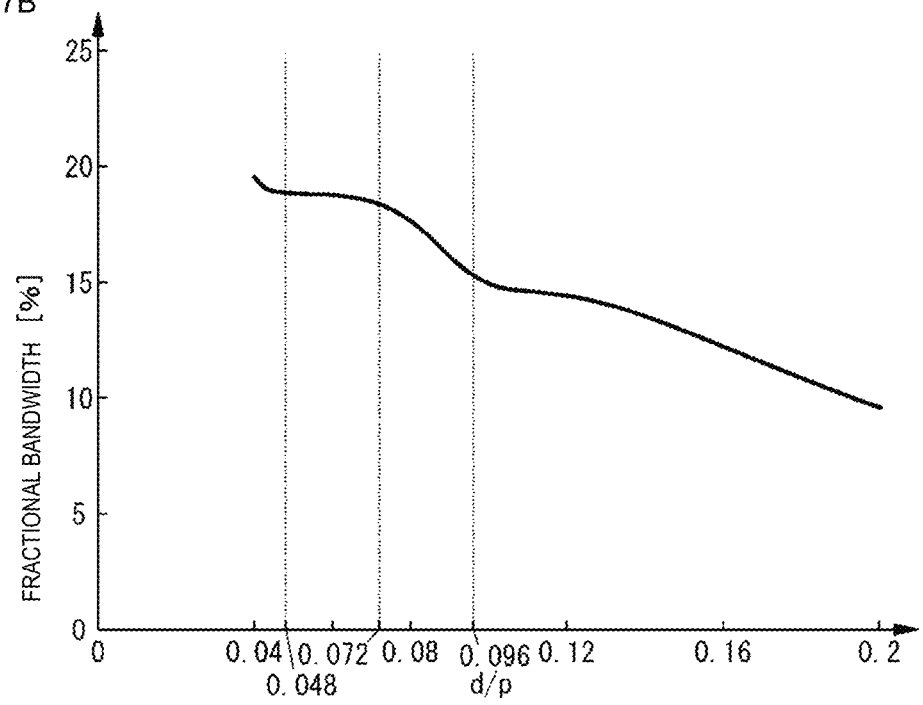
FIG. 7B is a graph showing a relationship between fractional bandwidth in the thickness-shear mode and [thicknesses of piezoelectric layer]/[inter-centerline distance between two electrodes forming a pair] and related to the above structural model and is a graph in which a range of about 0 to about 0.2 on a horizontal axis of FIG. 7A is enlarged.

FIGS. 7A and 7B are graphs each showing a relationship between fractional bandwidth and d/p of the structural model of the acoustic wave device according to Reference Preferred Embodiment 2 utilizing a thickness-shear mode. In FIGS. 7A and 7B, a horizontal axis indicates d/p and a vertical axis indicates the fractional bandwidth. FIGS. 7A and 7B each shows a case where the piezoelectric layer 4 is a 120° rotated Y-cut X-propagation $LiNbO_3$, but the same or similar tendency appears in cases of other cut angles. In addition, in the structural model of the acoustic wave device of the Reference Preferred Embodiment 2, even when the material of the piezoelectric layer 4 is, for example, $LiTaO_3$, a relationship between fractional bandwidth and d/p has the same or similar tendency to that in FIGS. 7A and 7B. In addition, in the structural model, regardless of the number of pairs of the first electrode 51 and the second electrode 52, a relationship between fractional bandwidth and d/p has the same or similar tendency to that in FIGS. 7A and 7B. Further, in the structural model, not only when the second main surface 42 of the piezoelectric layer 4 is in contact with air, but also when the second main surface 42 is in contact with the acoustic reflection layer 3, the relationship between the fractional bandwidth and d/p has the same or similar tendency to that in FIGS. 7A and 7B.

From FIG. 7A, it can be seen that a value of the fractional bandwidth changes drastically with d/p=about 0.5 as an inflection point in the structural model of the acoustic wave device according to Reference Preferred Embodiment 2. In the structural model of the acoustic wave device according to Reference Preferred Embodiment 2, when d/p≥about 0.5, a coupling coefficient is low and the fractional bandwidth is less than about 5%, regardless of how much d/p is changed within a range of about 0.5<d/p<about 1.6. On the other hand, in the structural model of the acoustic wave device according to Reference Preferred Embodiment 2, when d/p≤about 0.5, by changing d/p within a range of about 0<d/p≤about 0.5, the coupling coefficient can be increased and the fractional bandwidth can be set to be equal to or greater than about 5%.

In addition, in the structural model of the acoustic wave device according to Reference Preferred Embodiment 2, when d/p≤about 0.24, by changing d/p within a range of about 0<d/p≤about 0.24, the coupling coefficient can be further increased and the fractional bandwidth can be further increased. Even in the acoustic wave device 1 according to Preferred Embodiment 1, as illustrated in FIG. 2, in a section along the thickness direction D1 of the piezoelectric layer 4, when the inter-centerline distance between the first electrode 51 and the second electrode 52 is denoted as p, and the thickness of the piezoelectric layer 4 is denoted as d, a relationship between fractional bandwidth thereof and d/p exhibits the same or similar tendency to the relationship between fractional bandwidth and d/p of the structural model of the acoustic wave device according to Reference Preferred Embodiment 2.

In addition, in the structural model of the acoustic wave device according to Reference Preferred Embodiment 2, when d/p≤about 0.10, by changing d/p within a range of about 0<d/p≤about 0.10, the coupling coefficient can be further increased and the fractional bandwidth can be further increased.

FIG. 7B is a graph in which a portion of FIG. 7A is enlarged. As illustrated in FIG. 7B, in the structural model of the acoustic wave device according to Reference Preferred Embodiment 2, the fractional bandwidth changes with d/p=about 0.096 as an inflection point, thus, when d/p≤about 0.096, by changing d/p within a range of d/p≤about 0.096, the coupling coefficient can be further increased and the fractional bandwidth can be further increased as compared with a case of about 0.096<d/p. Further, as shown in FIG. 7B, the fractional bandwidth changes with d/p=about 0.072 and about 0.048 as respective inflection points, and by setting about 0.048≤d/p≤about 0.072, it is possible to reduce or prevent a change in the coupling coefficient due to a change in d/p and to set the fractional bandwidth to a substantially constant value.

Figure 8:
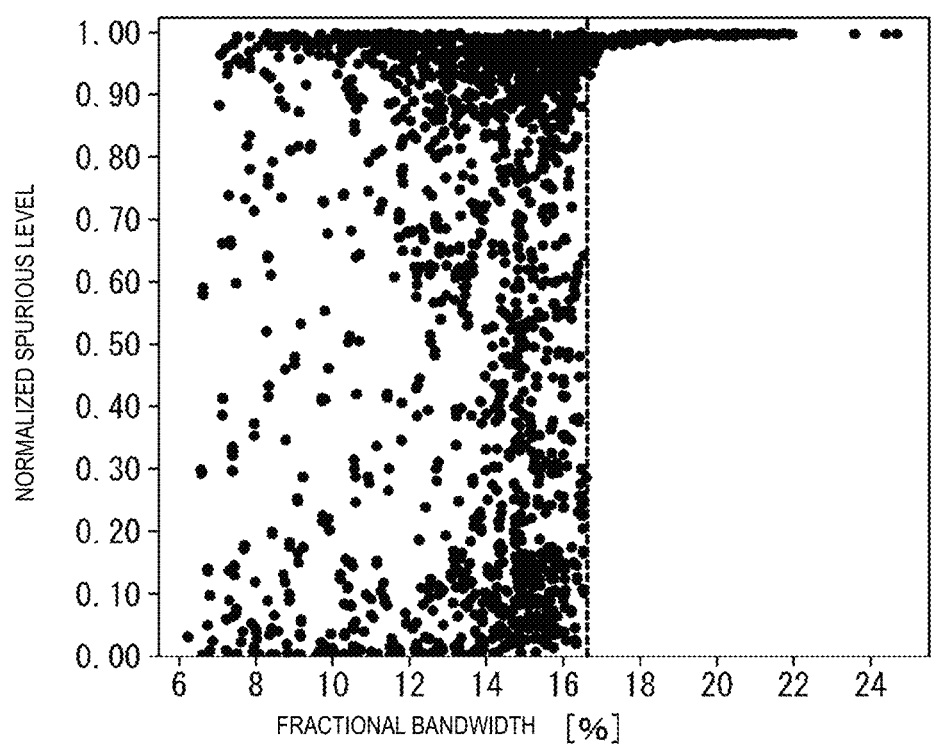
FIG. 8 is a graph showing a relationship between fractional bandwidth in the thickness-shear mode and normalized spurious level and related to the above structural model of the acoustic wave device.

FIG. 8 is a graph obtained by plotting a spurious level in a frequency band between a resonant frequency and an anti-resonant frequency, when the thickness d of the piezoelectric layer 4, the inter-centerline distance p between the first electrode 51 and the second electrode 52, the first electrode width H1, and the second electrode width H2 are changed in the structural model of the acoustic wave device according to Reference Preferred Embodiment 2 utilizing the thickness-shear mode. In FIG. 8, a horizontal axis indicates fractional bandwidth and a vertical axis indicates normalized spurious level. The normalized spurious level is a value obtained by normalizing a spurious level when a spurious level is defined as about 1 in a fractional bandwidth (for example, about 22%) in which a spurious level has the same or substantially the same value even when the thickness d of the piezoelectric layer 4, the inter-centerline distance p between the first electrode 51 and the second electrode 52, the first electrode width H1, and the second electrode width H2 are changed. FIG. 8 shows a case where a Z-cut $LiNbO_3$ with which the thickness-shear mode can be more suitably excited is provided for the piezoelectric layer 4, but the same or similar tendency appears in cases of other cut angles. In addition, in the structural model of the acoustic wave device according to Reference Preferred Embodiment 2, even when the material of the piezoelectric layer 4 is, for example, $LiTaO_3$, a relationship between a normalized spurious level and fractional bandwidth has the same or similar tendency to that in FIG. 8. In addition, in the structural model, regardless of the number of pairs of the first electrode 51 and the second electrode 52, a relationship between a normalized spurious level and fractional bandwidth has the same or similar tendency to that in FIG. 8. In addition, in the structural model, not only when the second main surface 42 of the piezoelectric layer 4 is in contact with air but also when the second main surface 42 is in contact with the acoustic reflection layer 3, a relationship between a normalized spurious level and fractional bandwidth has the same or similar tendency to that in FIG. 8.

Figure 9:
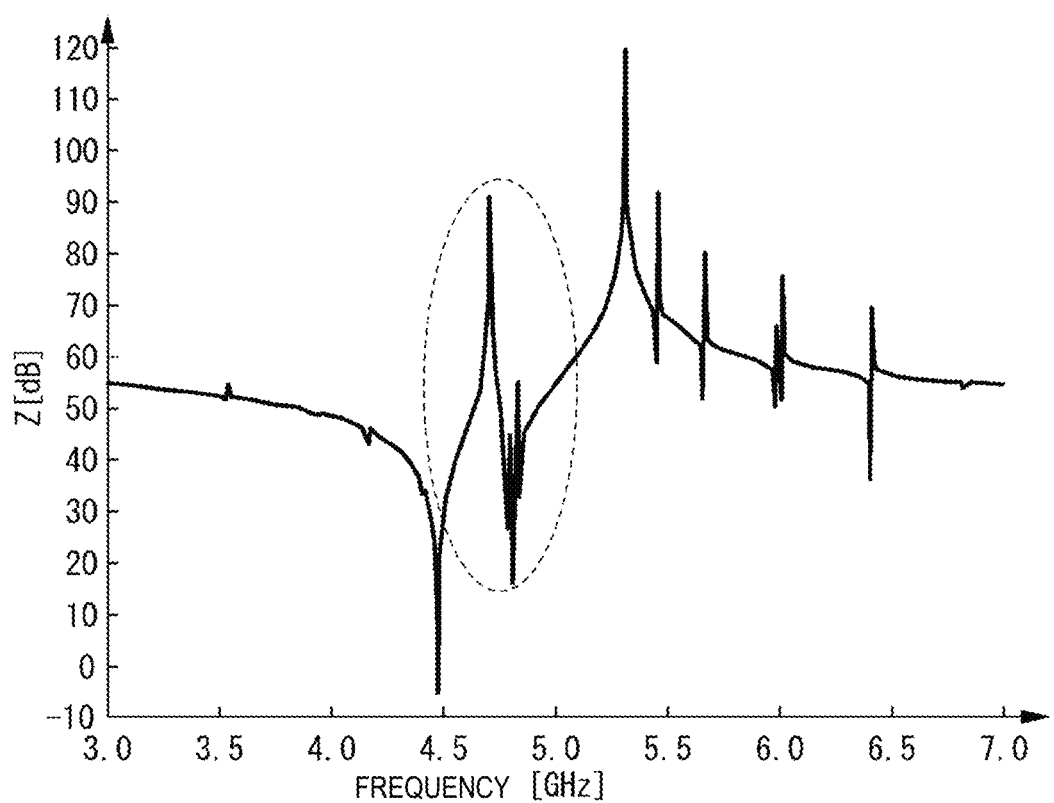
FIG. 9 is an impedance-frequency characteristic diagram of the above structural model of the acoustic wave device.

It can be seen from FIG. 8 that when the fractional bandwidth exceeds about 17%, the normalized spurious level is aggregated to about 1. This indicates that, when the fractional bandwidth is equal to or greater than about 17%, some sort of sub-resonance exists in a band between a resonant frequency and an anti-resonant frequency, as in frequency characteristics of impedance illustrated in FIG. 9. FIG. 9 shows frequency characteristics of impedance when a Z-cut $LiNbO_3$ having Euler angles of about (0°, 0°, 90°) is provided as the piezoelectric layer 4, and d/p=about 0.08, and MR=about 0.35 are set. In FIG. 9, a portion indicating the sub-resonance is surrounded by a broken line.

As described above, when the fractional bandwidth exceeds about 17%, even when the thickness d of the piezoelectric layer 4, the inter-centerline distance p between the first electrode 51 and the second electrode 52, the first electrode width H1, and the second electrode width H2 are changed, a large spurious level is included in the bandwidth between the resonant frequency and the anti-resonant frequency. Such a spurious level is generated by an overtone in a planar direction, mainly in the direction in which the first electrode 51 and the second electrode face each other. Thus, from a viewpoint of reducing or preventing a spurious level in the band, the fractional bandwidth is preferably equal to or less than about 17%, for example. Since the acoustic wave device 1 according to Preferred Embodiment 1 exhibits the same or similar tendency to that in the structural model of the acoustic wave device according to Reference Preferred Embodiment 2 even in a relationship between a normalized spurious level and fractional bandwidth, the fractional bandwidth is preferably equal to or less than about 17%, for example.

Figure 10:
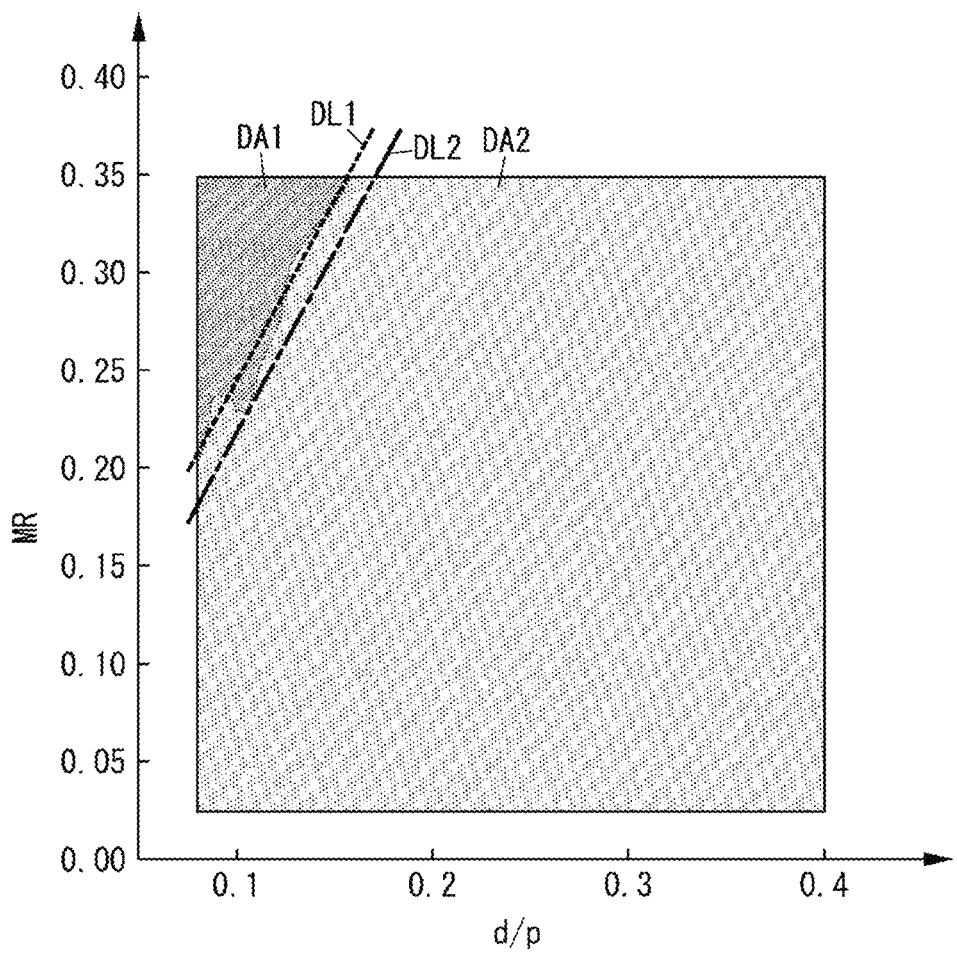
FIG. 10 is a diagram for explaining a distribution of fractional bandwidth in a combination of [thickness of piezoelectric layer]/[inter-centerline distance between first electrode and second electrode] and a structural parameter, related to the above structural model of the acoustic wave device.

FIG. 10 shows, with respect to the structural model of the acoustic wave device according to Reference Preferred Embodiment 2, a first distribution region DA1 in which a fractional bandwidth exceeds about 17% and a second distribution region DA2 in which a fractional bandwidth is equal to or less than about 17% are illustrated, when d/p and MR are used as parameters, in a case where a Z-cut $LiNbO_3$ is provided as the piezoelectric layer 4, and the thickness d of the piezoelectric layer 4, the inter-centerline distance p between the first electrode 51 and the second electrode 52, the first electrode width H1, and the second electrode widths H2 are changed. In FIG. 10, the first distribution region DA1 and the second distribution region DA2 are different in dot density, and the dot density in the first distribution region DA1 is higher than the dot density in the second distribution region DA2. In addition, in FIG. 10, an approximate straight line DL1 of a boundary line between the first distribution region DA1 and the second distribution region DA2 is indicated by a broken line. The approximate straight line DL1 is expressed by an equation of MR=1.75×(d/p)+0.075. Thus, in the structural model of the acoustic wave device according to Reference Preferred Embodiment 2, the fractional bandwidth can be equal to or less than about 17%, by satisfying a condition of MR≤1.75×(d/p)+0.075. FIG. 10 shows a case where a Z-cut $LiNbO_3$ with which the thickness-shear mode can be more suitably excited is provided for the piezoelectric layer 4, but the same or similar tendency appears in cases of other cut angles. In addition, in the structural model of the acoustic wave device according to Reference Preferred Embodiment 2, the approximate straight line DL1 is the same or substantially the same, even when the material of the piezoelectric layer 4 is, for example, $LiTaO_3$. In addition, in the structural model of the acoustic wave device according to Reference Preferred Embodiment 2, the approximate straight line DL1 is the same or substantially the same, regardless of the number of pairs of the first electrode 51 and the second electrode 52. In addition, in the structural model of the acoustic wave device according to Reference Preferred Embodiment 2, the approximate straight line DL1 is the same or substantially the same, not only when the second main surface 42 of the piezoelectric layer 4 is in contact with air, but also when the second main surface 42 is in contact with an acoustic reflection layer. As in the structural model of the acoustic wave device according to Reference Preferred Embodiment 2, in the acoustic wave device 1 according to Preferred Embodiment 1, the fractional bandwidth is easily set to be equal to or less than about 17%, by satisfying the condition of MR≤1.75×(d/p)+0.075. An approximate straight line DL2 (hereinafter, also referred to as a second approximate straight line DL2) indicated in FIG. 10 by an alternate long and short dash line separately from the approximate straight line DL1 (hereinafter, also referred to as a first approximate straight line DL1) is a line indicating a boundary for reliably setting the fractional bandwidth to equal to or less than 17%. The second approximate straight line DL2 is expressed by an equation of MR=1.75×(d/p)+0.05. Thus, in the structural model of the acoustic wave device according to Reference Preferred Embodiment 2 and the acoustic wave device 1 according to Preferred Embodiment 1, the fractional bandwidth can be reliably set to be equal to or less than about 17%, by satisfying a condition of MR≤1.75×(d/p)+0.05.

Figure 11:
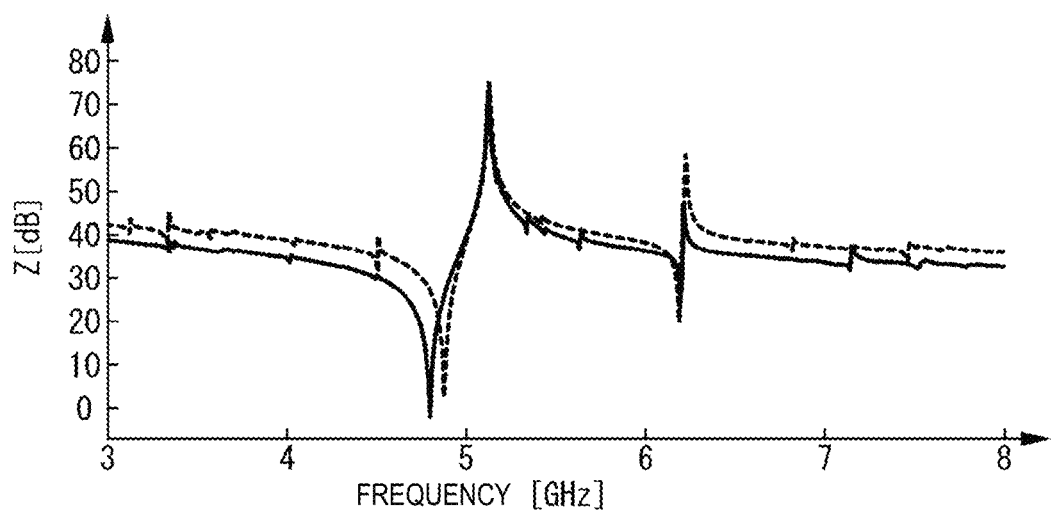
FIG. 11 is an impedance-frequency characteristic diagram of each of an acoustic wave device according to an application example of Preferred Embodiment 1 of the present invention and an acoustic wave device according to an example of Reference Preferred Embodiment 1 of the present invention.

FIG. 11 shows frequency characteristics of impedance of the acoustic wave device 1 according to Preferred Embodiment 1 and the acoustic wave device 1r according to Reference Preferred Embodiment 1. In FIG. 11, a horizontal axis indicates frequency, and a vertical axis indicates impedance Z [dB] of the acoustic wave device 1. Z [dB] is a value obtained by $Z=20\times\log_{10}|Z0|$, when impedance of the acoustic wave device 1 is Z0. In FIG. 11, an example of the frequency characteristics of impedance of the acoustic wave device 1 according to Preferred Embodiment 1 is indicated by a solid line, and an example of the frequency characteristics of impedance of the acoustic wave device 1r according to Reference Preferred Embodiment 1 is indicated by a broken line. It can be seen from FIG. 11 that, in the acoustic wave device 1 according to Preferred Embodiment 1, capacitance can be made larger, as compared with the acoustic wave device 1r according to Reference Preferred Embodiment 1.

(1.5) Advantageous Effects

The acoustic wave device 1 according to Preferred Embodiment 1 includes the piezoelectric layer 4, the first electrode 51, and the second electrode 52. The first electrode 51 and the second electrode 52 face each other in the direction D2 intersecting the thickness direction D1 of the piezoelectric layer 4. The acoustic wave device 1 utilizes a bulk wave in a thickness-shear primary mode. A material of the piezoelectric layer 4 is, for example, lithium niobate or lithium tantalate. Each of the first electrode 51 and the second electrode 52 is embedded in the piezoelectric layer 4.

In the acoustic wave device 1 according to Preferred Embodiment 1, a Q-value can be increased and a capacitance can be increased, while reducing in size the acoustic wave device 1 in plan view from the thickness direction D1 of the piezoelectric layer 4. Here, in the acoustic wave device 1 according to Preferred Embodiment 1, a resonant frequency is not restricted by an inter-centerline distance between the first electrode 51 and the second electrode 52, and the resonant frequency can be increased by reducing a thickness of the piezoelectric layer 4, and thus, high frequency can be supported while reducing in size the acoustic wave device 1 in plan view from the thickness direction D1 of the piezoelectric layer 4. In addition, in the acoustic wave device 1 according to Preferred Embodiment 1, each of the first electrode 51 and the second electrode 52 is embedded in the piezoelectric layer 4, thus, even when a capacitance generated between the first electrode 51 and the second electrode is decreased by reducing the thickness of the piezoelectric layer 4, the capacitance between the first electrode 51 and the second electrode 52 can be increased without increasing a planar size of each of the first electrode 51 and the second electrode 52.

Further, the acoustic wave device 1 according to Preferred Embodiment 1 includes the piezoelectric layer 4, the first electrode 51, and the second electrode 52. The first electrode 51 and the second electrode 52 face each other in the direction D2 intersecting the thickness direction D1 of the piezoelectric layer 4. In the acoustic wave device 1, in a section along the thickness direction D1 of the piezoelectric layer 4, d/p is equal to or less than about 0.5, where p is the inter-centerline distance between the first electrode 51 and the second electrode 52, and d is the thickness of the piezoelectric layer 4. The material of the piezoelectric layer 4 is, for example, lithium niobate or lithium tantalate. Each of the first electrode 51 and the second electrode 52 is embedded in the piezoelectric layer 4.

In the acoustic wave device 1 according to Preferred Embodiment 1, a Q-value can be increased and a capacitance can be increased, while reducing in size the acoustic wave device 1 in plan view from the thickness direction D1 of the piezoelectric layer 4.

In addition, in the acoustic wave device 1 according to Preferred Embodiment 1, the second main surface 42 of the piezoelectric layer 4 is constrained by the acoustic reflection layer 3, and thus unnecessary waves can be reduced or prevented. In addition, in the acoustic wave device 1 according to Preferred Embodiment 1, the material of the piezoelectric layer 4 is, for example. $LiNbO_3$ or $LiTaO_3$, and a material of the low acoustic impedance layer 31 is silicon oxide. Here, frequency-temperature characteristics of each of $LiNbO_3$ and $LiTaO_3$ have a negative inclination, and frequency-temperature characteristics of silicon oxide have a positive inclination. Thus, in the acoustic wave device 1 according to the preferred embodiment, an absolute value of a TCF (Temperature Coefficient of Frequency) can be reduced, and the frequency-temperature characteristics can be improved.

(1.6) Modified Example

Preferred Embodiment 1 described above is merely one of various preferred embodiments of the present invention.

Preferred Embodiment 1 described above can be modified in various ways according to design and the like, as long as at least one of the advantageous effects of various preferred embodiments of the present invention can be achieved.

Modified Example 1

Figure 12:
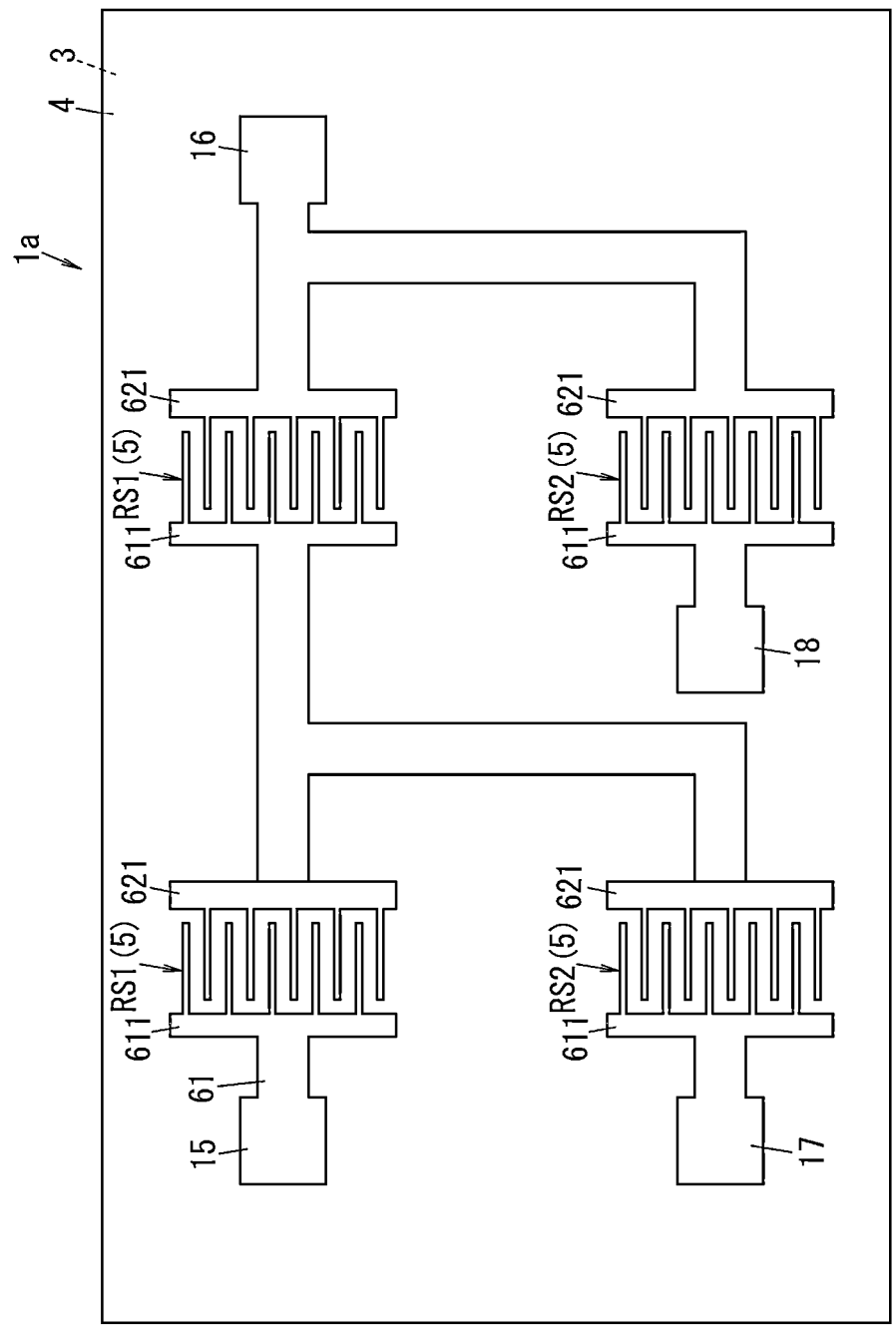
FIG. 12 is a plan view of an acoustic wave device according to Modified Example 1 of Preferred Embodiment 1 of the present invention.
Figure 13:
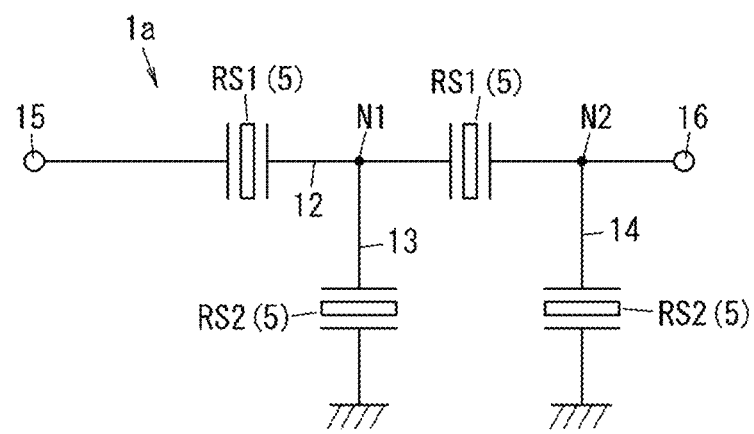
FIG. 13 is an equivalent circuit diagram of the acoustic wave device according to Modified Example 1 of Preferred Embodiment 1 of the present invention.

Hereinafter, an acoustic wave device 1a according to Modified Example 1 of Preferred Embodiment 1 will be described with reference to FIGS. 12 and 13. Note that, with respect to the acoustic wave device 1a according to Modified Example 1, the same or similar components to those of the acoustic wave device 1 according to Preferred Embodiment 1 are denoted by the same reference numerals, and a description thereof is omitted.

The acoustic wave device 1a according to Modified Example 1 is an acoustic wave filter (here, a ladder filter). The acoustic wave device 1a includes an input terminal 15, an output terminal 16, (for example, two) series-arm resonators RS1 provided on a first path 12 connecting the input terminal 15 and the output terminal 16, and (for example, two) parallel-arm resonators RS2 provided on respective (for example, two) second paths 13 and 14 connecting (for example, two) nodes N1 and N2 on the first path 12 and grounds (ground terminals 17 and 18), respectively. The ground terminals 17 and 18 may be one common ground.

In the acoustic wave device 1a, each of the series-arm resonators RS1 and the parallel-arm resonators RS2 is the acoustic wave resonator 5. Each of the acoustic wave resonators 5 is a resonator including at least one first electrode 51 and one second electrode 52. In the acoustic wave device 1a, the piezoelectric layer 4 is shared by the plurality of acoustic wave resonators 5. In addition, in the acoustic wave device 1a, the acoustic reflection layer 3 is shared by the plurality of acoustic wave resonators 5. A resonant frequency of the parallel-arm resonator RS2 is lower than a resonant frequency of the series-arm resonator RS1. Here, the acoustic wave resonator 5 defining the parallel-arm resonator RS2 includes, for example, a silicon oxide film provided on the first main surface 41 of the piezoelectric layer 4, whereas the acoustic wave resonator 5 defining the series-arm resonator RS1 does not include a silicon oxide film on the first main surface 41 of the piezoelectric layer 4. The acoustic wave resonator 5 defining the series-arm resonator RS1 may include a silicon oxide film on the first main surface 41 of the piezoelectric layer 4, and in this case, a thickness of a silicon oxide film of the acoustic wave resonator 5 defining the series-arm resonator RS1 only needs to be less than a thickness of a silicon oxide film of the acoustic wave resonator 5 defining the parallel-arm resonator RS2.

In the acoustic wave device 1a, the support substrate 2 and the acoustic reflection layer 3 are shared by the plurality of acoustic wave resonators 5. However, the high acoustic impedance layer 32 (second high acoustic impedance layer 322) closest to the piezoelectric layer 4 among the high acoustic impedance layers 32 may be isolated for each acoustic wave resonator 5.

Modified Example 2

Figure 14:
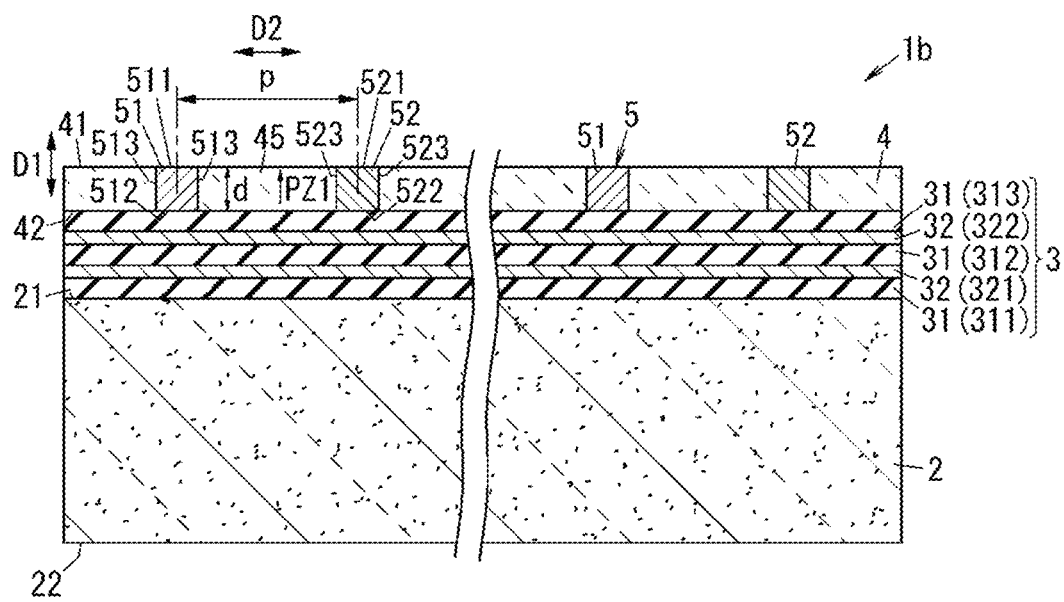
FIG. 14 is a sectional view of an acoustic wave device according to Modified Example 2 of Preferred Embodiment 1 of the present invention.

Hereinafter, an acoustic wave device 1b according to Modified Example 2 of Preferred Embodiment 1 will be described with reference to FIG. 14. With respect to the acoustic wave device 1b according to Modified Example 2, the same or similar components to those of the acoustic wave device 1 according to Preferred Embodiment 1 are denoted by the same reference numerals, and a description thereof is omitted.

The acoustic wave device 1b according to Modified Example 2 differs from the acoustic wave device 1 according to Preferred Embodiment 1 in that first electrode 51 and the second electrode 52 penetrate the piezoelectric layer 4.

In the acoustic wave device 1b according to Modified Example 2, the second main surface 512 of each of the first electrodes 51 and the second main surface 42 of the piezoelectric layer 4 are flush with each other, and the first main surface 511 of each of the first electrodes 51 and the first main surface 41 of the piezoelectric layer 4 are flush with each other. The second main surface 512 of each of the first electrodes 51 is in contact with the acoustic reflection layer 3.

In addition, in the acoustic wave device 1b, the second main surface 522 of each of the second electrodes 52 and the second main surface 42 of the piezoelectric layer 4 are flush with each other, and the first main surface 521 of each of the second electrodes 52 and the first main surface 41 of the piezoelectric layer 4 are flush with each other. The second main surface 522 of each of the second electrodes 52 is in contact with the acoustic reflection layer 3.

In the acoustic wave device 1b according to Modified Example 2, an area of the side surface 513 of the first electrode 51 that faces the second electrode 52 and is in contact with the piezoelectric layer 4, and an area of the side surface 523 of the second electrode 52 that faces the first electrode 51 and is in contact with the piezoelectric layer 4, can be increased, as compared with the acoustic wave device 1 according to Preferred Embodiment 1. Accordingly, a capacitance of the acoustic wave device 1b according to Modified Example 2 can be increased without changing a size of the piezoelectric layer 4 in plan view from the thickness direction D1, as compared with the acoustic wave device 1 according to Preferred Embodiment 1.

Modified Example 3

Figure 15:
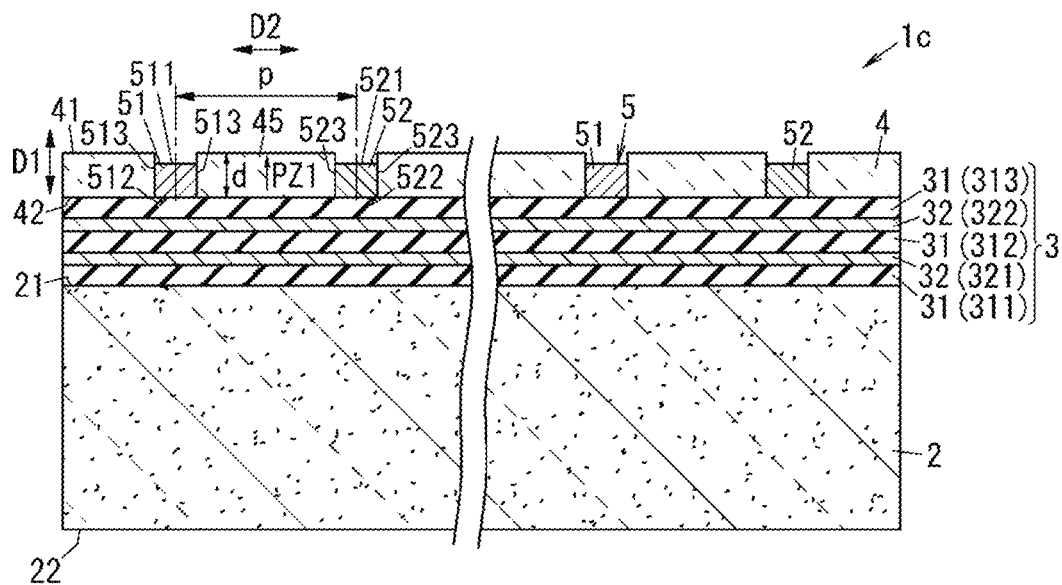
FIG. 15 is a sectional view of an acoustic wave device according to Modified Example 3 of Preferred Embodiment 1 of the present invention.

Hereinafter, an acoustic wave device 1c according to Modified Example 3 of Preferred Embodiment 1 will be described with reference to FIG. 15. With respect to the acoustic wave device 1c according to Modified Example 3, the same or similar components to those of the acoustic wave device 1b according to Modified Example 2 are denoted by the same reference numerals, and a description thereof is omitted.

The acoustic wave device 1c according to Modified Example 3 differs from the acoustic wave device 1b according to Modified Example 2 in that the first main surface 511 of each of the first electrodes 51 is recessed from the first main surface 41 of the piezoelectric layer 4, and the first main surface 521 of each of the second electrodes 52 is recessed from the first main surface 41 of the piezoelectric layer 4.

Modified Example 4

Figure 16:
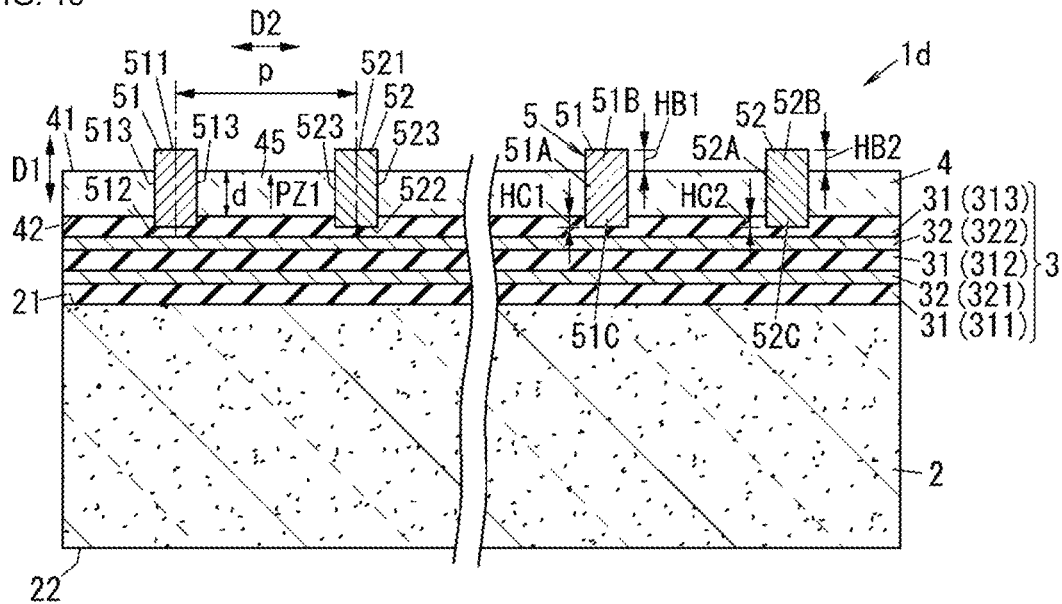
FIG. 16 is a sectional view of an acoustic wave device according to Modified Example 4 of Preferred Embodiment 1 of the present invention.

Hereinafter, an acoustic wave device 1d according to Modified Example 4 of Preferred Embodiment 1 will be described with reference to FIG. 16. With respect to the acoustic wave device 1d according to Modified Example 4, the same or similar components to those of the acoustic wave device 1b according to Modified Example 2 are denoted by the same reference numerals, and a description thereof is omitted.

In the acoustic wave device 1d according to Modified Example 4, the first electrode 51 and the second electrode 52 each include a portion protruding from the piezoelectric layer 4. Here, the first electrode 51 includes a penetrating portion 51A penetrating the piezoelectric layer 4, a first protruding portion 51B connected to the penetrating portion 51A and protruding from the first main surface 41 of the piezoelectric layer 4, and a second protruding portion 51C connected to the penetrating portion 51A and protruding from the second main surface 42 of the piezoelectric layer 4, and the second electrode 52 includes a penetrating portion 52A penetrating the piezoelectric layer 4, a first protruding portion 52B connected to the penetrating portion 52A and protruding from the first main surface 41 of the piezoelectric layer 4, and a second protruding portion 52C connected to the penetrating portion 52A and protruding from the second main surface 42 of the piezoelectric layer 4. Thus, in the acoustic wave device 1d according to Modified Example 4, a capacitance between the first electrode 51 and the second electrode 52 can be increased, as compared with the acoustic wave device 1b according to Modified Example 2.

In the acoustic wave device 1d according to Modified Example 4, in the first electrode 51, a protruding dimension HB1 of the first protruding portion 51B is greater than a protrusion dimension HC1 of the second protrusion portion 51C, and in the second electrode 52, a protruding dimension HB2 of the first protruding portion 52B is greater than a protrusion dimension HC2 of the second protrusion portion 52C. Thus, in the acoustic wave device 1d according to Modified Example 4, it is possible to improve heat dissipation as compared with a case where the protruding dimension HB1 of the first protruding portion 51B is the same or substantially the same as the protruding dimension HC1 of the second protruding portion 51C, and the protruding dimension HB2 of the first protruding portion 52B is the same or substantially the same as the protruding dimensions HC2 of the second protruding portion 52C.

In the acoustic wave device 1d according to Modified Example 4, the first electrode 51 includes both the first protruding portion 51B and the second protruding portion 51C, and the second electrode 52 includes both the first protruding portion 52B and the second protruding portion 52C. However, the present invention is not limited thereto, and a configuration may be provided in which only one of the first protruding portions 51B and 52B, and only one of the second protruding portions 51C and 52C are provided.

Modified Example 5

Figure 17:
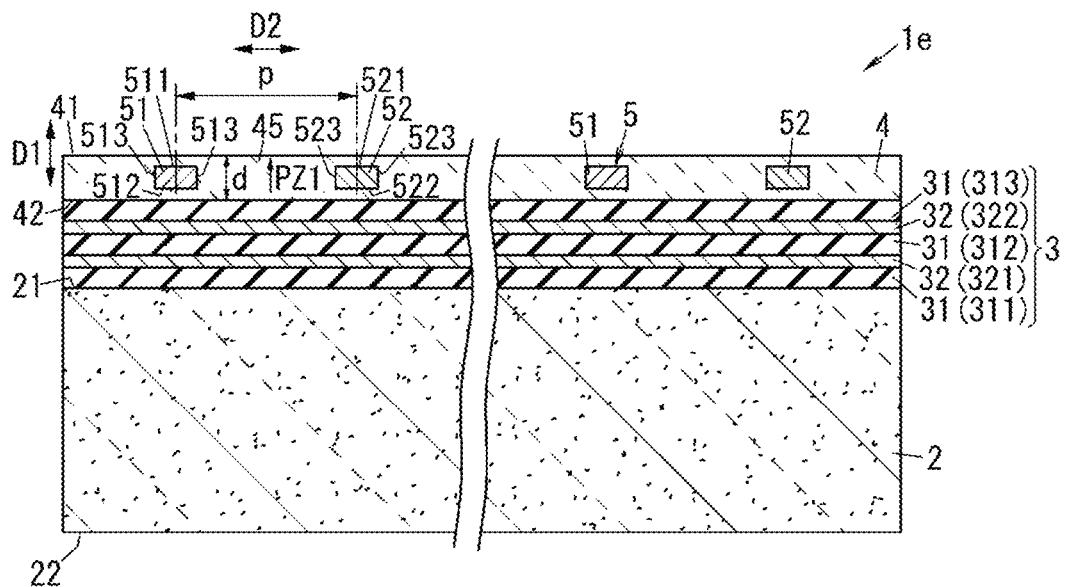
FIG. 17 is a sectional view of an acoustic wave device according to Modified Example 5 of Preferred Embodiment 1 of the present invention.

Hereinafter, an acoustic wave device 1e according to Modified Example 5 of Preferred Embodiment 1 will be described with reference to FIG. 17. With respect to the acoustic wave device 1e according to Modified Example 5, the same or similar components to those of the acoustic wave device 1 according to Preferred Embodiment 1 are denoted by the same reference numerals, and a description thereof is omitted.

The acoustic wave device 1e according to Modified Example 5 differs from the acoustic wave device 1 according to Preferred Embodiment 1 in that the first electrode 51 and the second electrode 52 are embedded in the piezoelectric layer 4, and the first main surface 511 of the first electrode 51 and the first main surface 521 of the second electrode 52 are also in contact with the piezoelectric layer 4.

In the acoustic wave device 1e according to Modified Example 5, a portion of the piezoelectric layer 4 is located between the first main surface 511 of the first electrode 51 and the first main surface 41 of the piezoelectric layer 4. In addition, in the acoustic wave device 1e according to Modified Example 5, a portion of the piezoelectric layer 4 is located between the first main surface 521 of the second electrode 52 and the first main surface 41 of the piezoelectric layer 4. In the acoustic wave device 1e according to Modified Example 5, at the time of manufacturing thereof, the piezoelectric layer 4 only needs to be formed by, for example, a film forming technique.

The acoustic wave device 1e according to Modified Example 5 has an advantage, as compared with the acoustic wave device 1 according to Preferred Embodiment 1, in that variations in a capacitance between the first electrode 51 and the second electrode 52 can be easily reduced or prevented.

Modified Example 6

Figure 18:
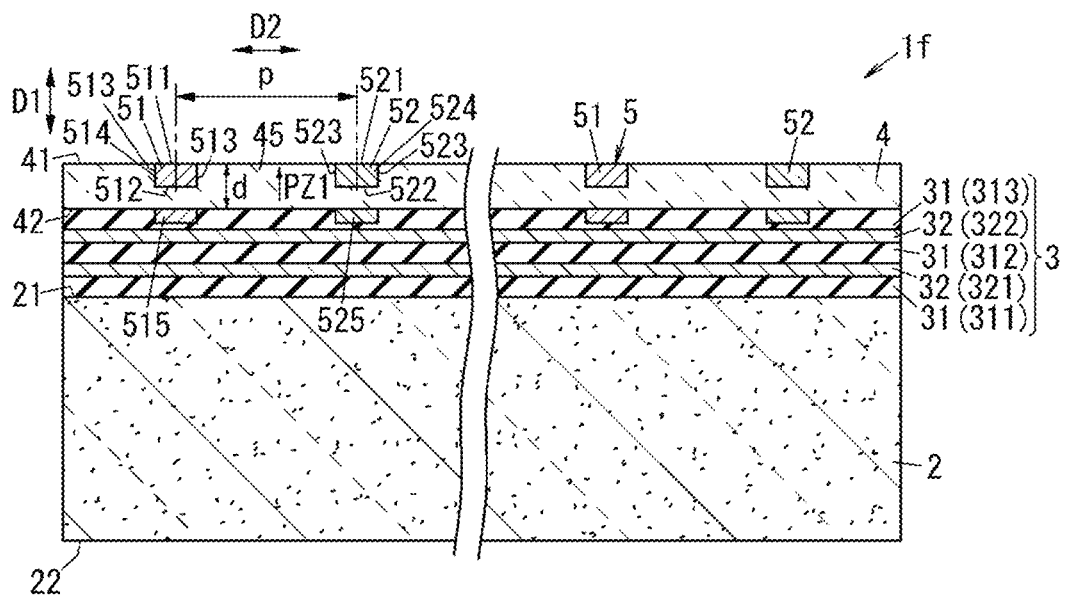
FIG. 18 is a sectional view of an acoustic wave device according to Modified Example 6 of Preferred Embodiment 1 of the present invention.

Hereinafter, an acoustic wave device 1f according to Modified Example 6 of Preferred Embodiment 1 will be described with reference to FIG. 18. With respect to the acoustic wave device 1f according to Modified Example 6, the same or similar components to those of the acoustic wave device 1 according to Preferred Embodiment 1 are denoted by the same reference numerals, and a description thereof is omitted.

The acoustic wave device 1f according to Modified Example 6 differs from the acoustic wave device 1 according to Preferred Embodiment 1 in that, in addition to portions 514 and 524 embedded in the piezoelectric layer 4, the first electrode 51 and the second electrode 52 respectively include portions 515 and 525 embedded in the low acoustic impedance layer 31 of the acoustic reflection layer 3.

In the acoustic wave device 1f according to Modified Example 6, a capacitance between the first electrode 51 and the second electrode 52 can be increased, as compared with the acoustic wave device 1 according to Preferred Embodiment 1. Note that, a material of the high acoustic impedance layer 32 is not limited to a conductor such as, for example, Pt and may be an insulator (for example, silicon nitride, aluminum nitride, alumina, tantalum oxide, or the like). When the material of the high acoustic impedance layer 32 is an insulator, the first electrode 51 and the second electrode 52 may be embedded in the low acoustic impedance layer 31 and the high acoustic impedance layer 32. In addition, in the acoustic reflection layer 3, a layer in contact with the second main surface 42 of the piezoelectric layer 4 may be the high acoustic impedance layer 32, and in this case, the first electrode 51 and the second electrode 52 may be embedded in the high acoustic impedance layer 32, or may be embedded in the high acoustic impedance layer 32 and the low acoustic impedance layer 31.

Modified Example 7

Figure 19:
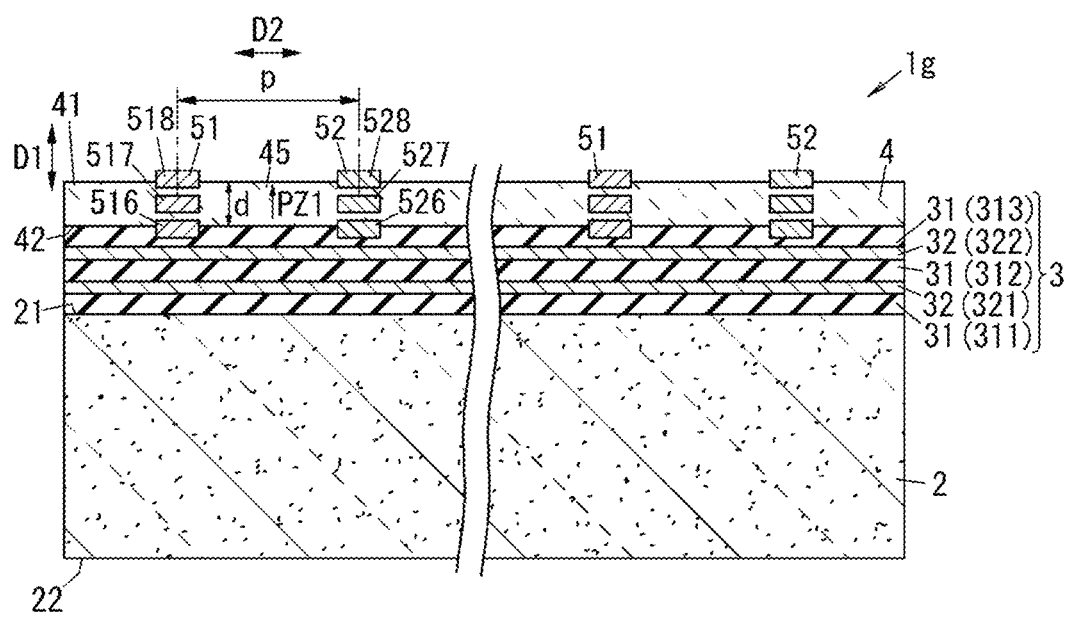
FIG. 19 is a sectional view of an acoustic wave device according to Modified Example 7 of Preferred Embodiment 1 of the present invention.

Hereinafter, an acoustic wave device 1g according to Modified Example 7 of Preferred Embodiment 1 will be described with reference to FIG. 19. With respect to the acoustic wave device 1g according to Modified Example 7, similar components to those of the acoustic wave device 1 according to Preferred Embodiment 1 are denoted by the same reference numerals, and a description thereof is omitted.

In the acoustic wave device 1g according to Modified Example 7, in the first electrode 51 and the second electrode 52, the first electrode 51 includes (for example, three) conductor portions 516, 517, and 518 arranged in the thickness direction D1 of the piezoelectric layer 4, and the second electrode 52 includes (for example, three) conductor portions 526, 527, and 528 arranged in the thickness direction D1 of the piezoelectric layer 4.

In the first electrode 51, the conductor portion 516, the conductor portion 517, and the conductor portion 518 are provided in this order from a side of the acoustic reflection layer 3. The conductor portion 516 is embedded in the low acoustic impedance layer 31 (third low acoustic impedance layer 313) of the acoustic reflection layer 3, and the piezoelectric layer 4. The conductor portion 517 is embedded in the piezoelectric layer 4. In addition, in the first electrode 51, a part of the conductor portion 518 is embedded in the piezoelectric layer 4.

In addition, in the second electrode 52, the conductor portion 526, the conductor portion 527, and the conductor portion 528 are provided in this order from the side of the acoustic reflection layer 3. The conductor portion 526 is embedded in the low acoustic impedance layer 31 (third low acoustic impedance layer 313) of the acoustic reflection layer 3, and the piezoelectric layer 4. The conductor portion 527 is embedded in the piezoelectric layer 4. In addition, in the second electrode 52, a part of the conductor portion 528 is embedded in the piezoelectric layer 4.

In the acoustic wave device 1*g* according to Modified Example 7, a capacitance between the first electrode 51 and the second electrode 52 can be increased, as compared with the acoustic wave device 1 according to Preferred Embodiment 1.

In the acoustic wave device 1*g* according to Modified Example 7, the three conductor portions 516, 517, and 518 are included in the first electrode 51. However, the number of the conductor portions included in the first electrode 51 is not limited to three and may be two, or four or more. In addition, in the acoustic wave device 1*g* according to Modified Example 7, the three conductor portions 526, 527, and 528 are included in the second electrode 52. However, the number of the conductor portions included in the second electrode 52 is not limited to three and may be two, or four or more. In the acoustic wave device 1*g* according to Modified Example 7, at the time of manufacturing thereof, for example, it is sufficient that the piezoelectric layer 4 is formed in a plurality of steps by, for example, a film forming technique, and the first electrode 51 and the second electrode 52 are formed in a plurality of steps. An air layer may be formed between two of the conductor portions, 516 and 517 adjacent to each other in the thickness direction D1 of the piezoelectric layer 4, or an air layer may be formed between two of the conductor portions, 517 and 518. Such a structure can be formed by utilizing, for example, a micromachining technique using a sacrificial layer.

Modified Example 8

Figure 20:
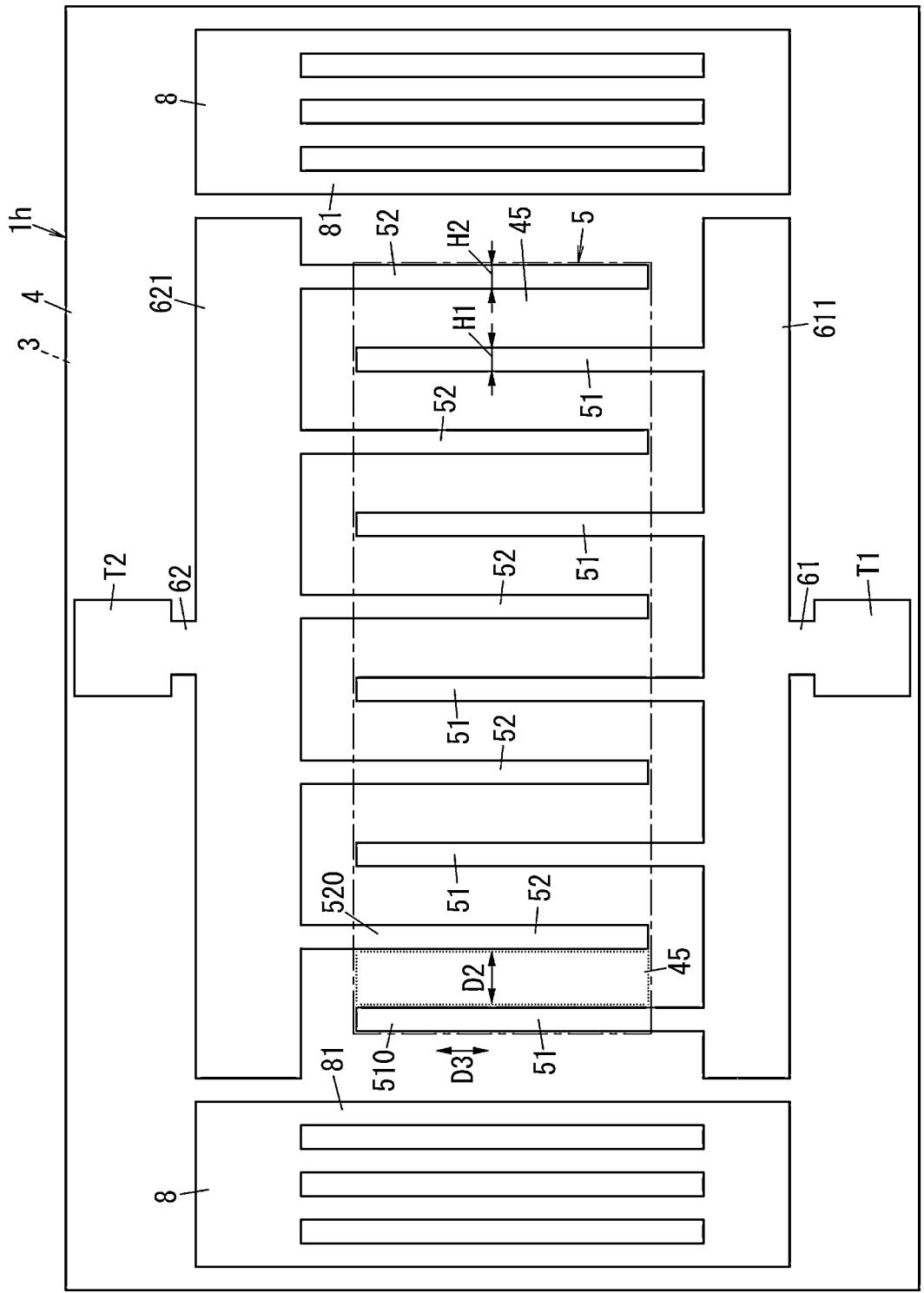
FIG. 20 is a plan view of an acoustic wave device according to Modified Example 8 of Preferred Embodiment 1 of the present invention.

Hereinafter, an acoustic wave device 1*h* according to Modified Example 8 of Preferred Embodiment 1 will be described with reference to FIG. 20. With respect to the acoustic wave device 1*h* according to Modified Example 8, the same or similar components to those of the acoustic wave device 1 according to Preferred Embodiment 1 are denoted by the same reference numerals, and a description thereof is omitted.

The acoustic wave device 1*h* according to Modified Example 8 differs from the acoustic wave device 1 according to Preferred Embodiment 1 in that two reflectors 8 are further provided.

Each of the two reflectors 8 is a short-circuited grating. Each reflector 8 does not reflect a bulk wave in a primary shear mode, but reflects an unnecessary surface acoustic wave propagating along the first main surface 41 of the piezoelectric layer 4. One reflector 8 of the two reflectors 8 is located on a side opposite to a side of the second electrode 52 of the first electrode 51 of a plurality of first electrodes 51 located at an end in a direction along a propagation direction of an unnecessary surface acoustic wave of the acoustic wave device 1*h*. The other one reflector 8 of the two reflectors 8 is located on a side opposite to a side of the first electrode 51 of the second electrode 52 of a plurality of second electrodes 52 located at an end in the direction along the propagation direction of the unnecessary surface acoustic wave of the acoustic wave device 1*h*.

Each reflector 8 includes a plurality of (for example, three) electrode fingers 81, and one end of each of the respective electrode fingers 81 is short-circuited to each other, and another end is short-circuited to each other. In each reflector 8, the number of the electrode fingers 81 is not particularly limited.

Each reflector 8 is electrically conductive. A material of each reflector 8 is, for example, Al, Cu, Pt, Au, Ag, Ti, Ni, Cr, Mo, W, an alloy mainly containing any one of these metals, or the like. Further, each reflector 8 may have a structure in which metal films made of these metals or alloys are laminated. Each reflector 8 includes, for example, a laminated film including an adhesion film made of a Ti film on the piezoelectric layer 4, and a main electrode film made of an Al film on the adhesion film. A thickness of the adhesion film is, for example, about 10 nm. Further, a thickness of the main electrode film is, for example, about 80 nm.

In addition, in the acoustic wave device 1*h* according to Modified Example 8, each reflector 8 is a short-circuited grating but is not limited thereto and may be, for example, an open grating, a positive-negative reflection grating, a grating in which a short-circuited grating and an open grating are combined, or the like. In addition, in the acoustic wave device 1*h*, two reflectors 8 are provided, however, only one of the two reflectors 8 may be provided.

Preferred Embodiment 2

Figure 21:
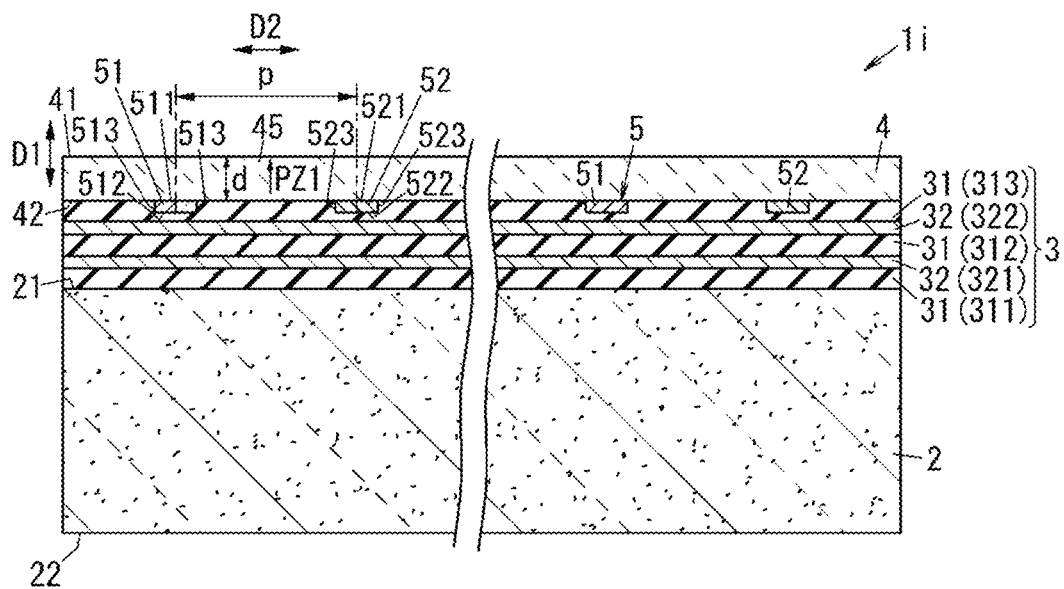
FIG. 21 is a sectional view of an acoustic wave device according to Preferred Embodiment 2 of the present invention.

Hereinafter, an acoustic wave device 1*i* according to Preferred Embodiment 2 of the present invention will be described with reference to FIG. 21. With respect to the acoustic wave device 1*i* according to Preferred Embodiment 2, the same or similar components to those of the acoustic wave device 1 according to Preferred Embodiment 1 are denoted by the same reference numerals, and a description thereof is omitted.

The acoustic wave device 1*i* according to Preferred Embodiment 2 differs from the acoustic wave device 1 according to Preferred Embodiment 1 in that the first electrode 51 and the second electrode 52 are embedded in the acoustic reflection layer 3 and are in contact with the piezoelectric layer 4.

The first electrode 51 and the second electrode 52 are in planar contact with the second main surface 42 of the piezoelectric layer 4. Further, a portion of the low acoustic impedance layer 31 (third low acoustic impedance layer 313) of the acoustic reflection layer 3 is interposed between the first electrode 51 and the second electrode 52 in the second direction D2. In the acoustic reflection layer 3, a material of the low acoustic impedance layer 31 is, for example, silicon oxide, and a material of the high acoustic impedance layer 32 is, for example, Pt. The portion of the low acoustic impedance layer 31 interposed between the first electrode 51 and the second electrode 52 also has a function as a dielectric portion interposed between the first electrode 51 and the second electrode 52. A thickness of each of the first electrode 51 and the second electrode 52 is less than a thickness of the low acoustic impedance layer 31. Thus, the first electrode 51 and the second electrode 52 are not in contact with the high acoustic impedance layer 32.

The acoustic wave device 1i according to Preferred Embodiment 2 includes the piezoelectric layer 4, the first electrode 51, and the second electrode 52. The first electrode 51 and the second electrode 52 face each other in the direction D2 intersecting the thickness direction D1 of the piezoelectric layer 4. The acoustic wave device 1 utilizes a bulk wave in a thickness-shear primary mode. A material of the piezoelectric layer 4 is, for example, lithium niobate or lithium tantalate. The piezoelectric layer 4 is provided on the acoustic reflection layer 3. At least a portion of each of the first electrode 51 and the second electrode 52 is embedded in the acoustic reflection layer 3 and is in contact with the piezoelectric layer 4.

In the acoustic wave device 1i according to Preferred Embodiment 2, a Q-value can be increased and a capacitance can be increased, while achieving size reduction of the acoustic wave device 1i in plan view from the thickness direction D1 of the piezoelectric layer 4.

Further, the acoustic wave device 1i according to Preferred Embodiment 2 includes the piezoelectric layer 4, the first electrode 51, and the second electrode 52. The first electrode 51 and the second electrode 52 face each other in the direction D2 intersecting the thickness direction D1 of the piezoelectric layer 4. In the acoustic wave device 1, in a section along the thickness direction D1 of the piezoelectric layer 4, d/p is equal to or less than about 0.5, where p is an inter-centerline distance between the first electrode 51 and the second electrode 52, and d is a thickness of the piezoelectric layer 4. The material of the piezoelectric layer 4 is, for example, lithium niobate or lithium tantalate. The piezoelectric layer 4 is provided on the acoustic reflection layer 3. At least a portion of each of the first electrode 51 and the second electrode 52 is embedded in the acoustic reflection layer 3 and is in contact with the piezoelectric layer 4.

In the acoustic wave device 1i according to Preferred Embodiment 2, a Q-value can be increased and capacitance can be increased, while achieving size reduction of the acoustic wave device 1i in plan view from the thickness direction D1 of the piezoelectric layer 4. In the acoustic wave device 1i according to Preferred Embodiment 2, since a portion of the low acoustic impedance layer 31 made of, for example, silicon oxide, which is a type of dielectric, is interposed between the first electrode 51 and the second electrode 52 facing each other, the capacitance between the first electrode 51 and the second electrode 52 can be increased. In addition, in the acoustic wave device 1i according to Preferred Embodiment 2, since the first electrode 51 and the second electrode 52 face the high acoustic impedance layer 32 made of, for example, Pt, which is a type of conductor, with the low acoustic impedance layer 31 interposed therebetween, the capacitance between the first electrode 51 and the second electrode 52 can be further increased.

When the material of the high acoustic impedance layer (second high acoustic impedance layer 322) is not metal but an insulator, the first electrode 51 and the second electrode 52 may be in contact with the high acoustic impedance layer 32 or may be embedded in the high acoustic impedance layer 32.

Preferred Embodiment 2 described above is merely one of various preferred embodiments of the present invention. Preferred Embodiment 2 described above can be modified in various ways according to design and the like, as long as at least one of the advantageous effects of various preferred embodiments of the present invention can be achieved.

Modified Example 1 of Preferred Embodiment 2

Figure 22:
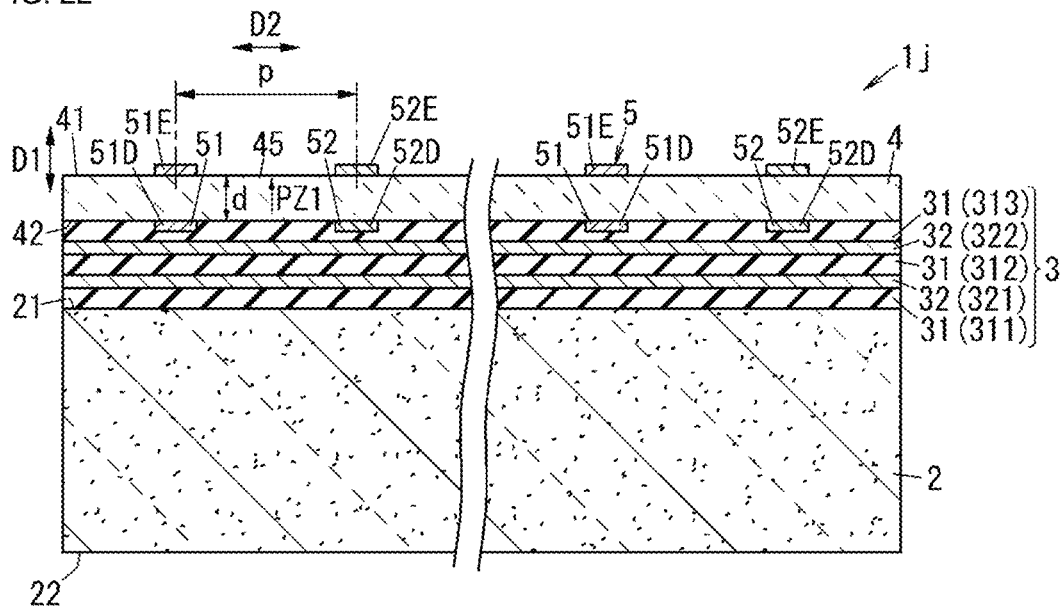
FIG. 22 is a sectional view of an acoustic wave device according to a Modified Example of Preferred Embodiment 2 of the present invention.

Hereinafter, an acoustic wave device 1j according to Modified Example 1 of Preferred Embodiment 2 will be described with reference to FIG. 22. With respect to the acoustic wave device 1j according to Modified Example 1, the same or similar components to those of the acoustic wave device 1i according to Preferred Embodiment 2 are denoted by the same reference numerals, and a description thereof is omitted.

In the acoustic wave device 1j according to Modified Example 1 of Preferred Embodiment 2, the first electrode 51 includes a bottom electrode 51D, and a top electrode 51E, and the second electrode 52 includes a bottom electrode 52D, and a top electrode 52E. The bottom electrodes 51D and 52D are embedded in the acoustic reflection layer 3 and are in planar contact with the second main surface 42 of the piezoelectric layer 4. The top electrodes 51E and 52E are provided on the first main surface 41 of the piezoelectric layer 4 and are in planar contact with the first main surface 41.

A capacitance of the acoustic wave device 1j according to Modified Example 1 of the Preferred Embodiment 2 can be made larger, as compared with the acoustic wave device 1i according to Preferred Embodiment 2.

Other Modified Examples of Preferred Embodiment 2

In the acoustic wave device 1j, a sectional shape of each of the top electrodes 51E and 52E is a rectangular or substantially rectangular shape but is not limited thereto. The top electrodes 51E and 52E may each have a shape in which a width of a lower end is greater than a width of an upper end, for example, as in any one of FIGS. 23A to 23D. This makes it possible to increase a capacitance between the first electrode 51 and the second electrode 52, without increasing a width of an upper surface of each of the top electrodes 51E and 52E.

Figure 23A:
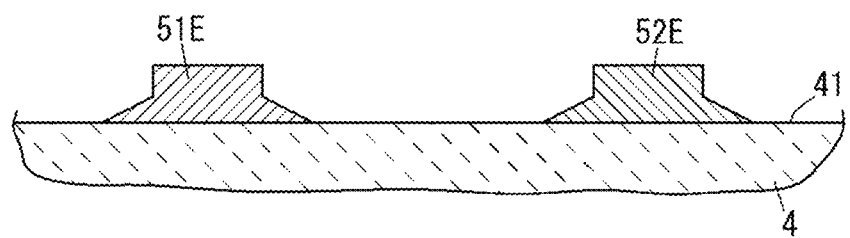
FIGS. 23A to 23D are sectional views each illustrating another shape of a pair of electrodes of the acoustic wave device according to the Modified Example of Preferred Embodiment 2 of the present invention.
Figure 23B:
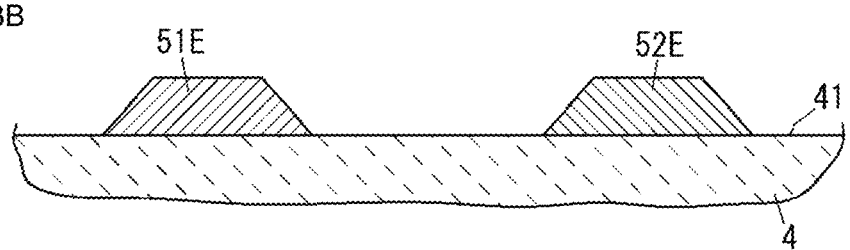
Figure 23C:
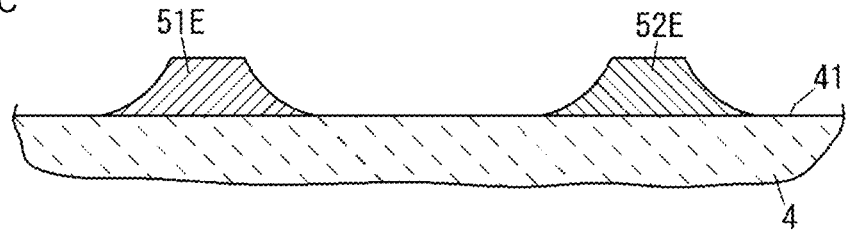
Figure 23D:
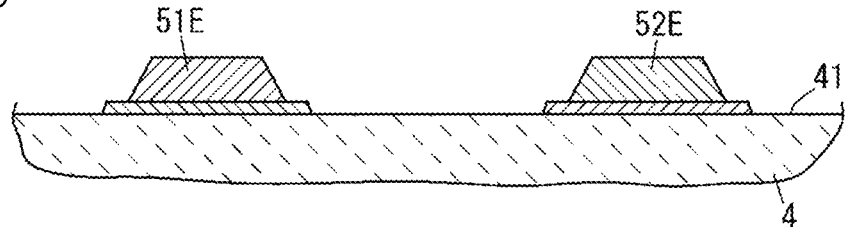

Each of the top electrodes 51E and 52E illustrated in FIG. 23A includes a portion with a constant or substantially constant width on an upper end side, and a portion with a gradually increasing width on a lower end side. Further, the top electrodes 51E and 52E illustrated in FIG. 23B each have a trapezoidal or substantially trapezoidal shape in cross section. In addition, each of the top electrodes 51E and 52E illustrated in FIG. 23C has a shape spreading toward an end, and both side surfaces in a width direction are curved surfaces. In addition, the top electrodes 51E and 52E illustrated in FIG. 23D each include a portion with a trapezoidal or substantially trapezoidal shape in section on an upper end side, and a portion on a lower end side with a trapezoidal or substantially trapezoidal shape in section wider than the portion having the trapezoidal or substantially trapezoidal shape in section on the upper end side.

Figure 24A:
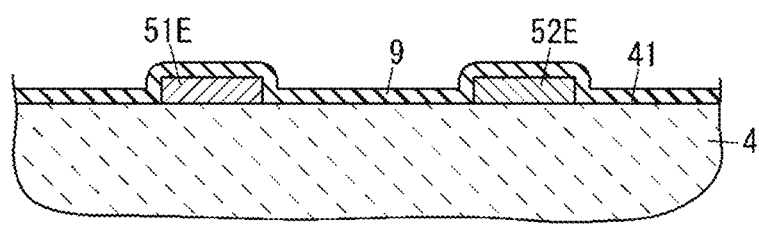
FIGS. 24A to 24C are sectional views each illustrating another configuration example of the acoustic wave device according to the Modified Example of Preferred Embodiment 2 of the present invention.
Figure 24B:
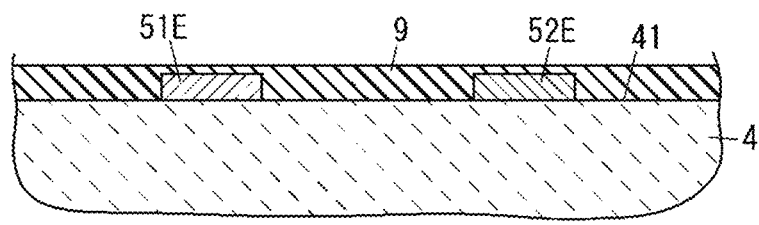
Figure 24C:
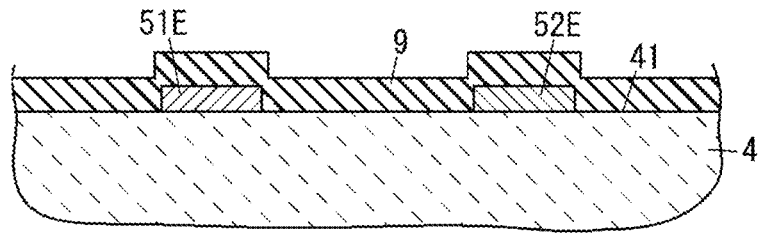

Additionally, as illustrated in any one of FIGS. 24A to 24C, the acoustic wave device 1j may include a dielectric film 9 covering the first main surface 41 of the piezoelectric layer 4, and the top electrodes 51E and 52E on the first main surface 41. In FIG. 24A, a thickness of the dielectric film 9 is less than a thickness of each of the top electrodes 51E and 52E, and a surface of the dielectric film 9 has a concavo-convex shape along a shape of a base. In FIG. 24B, surface of the dielectric film 9 is flattened to be planar. In FIG. 24C, a thickness of the dielectric film 9 is greater than a thickness of each of the top electrodes 51E and 52E, and a surface of the dielectric film 9 has a concavo-convex shape along a shape of a base.

These Modified Examples can be applied to the acoustic wave device 1 according to Preferred Embodiment 1 and an acoustic wave device 1k according to Preferred Embodiment 3 described later.

Preferred Embodiment 3

Figure 26:
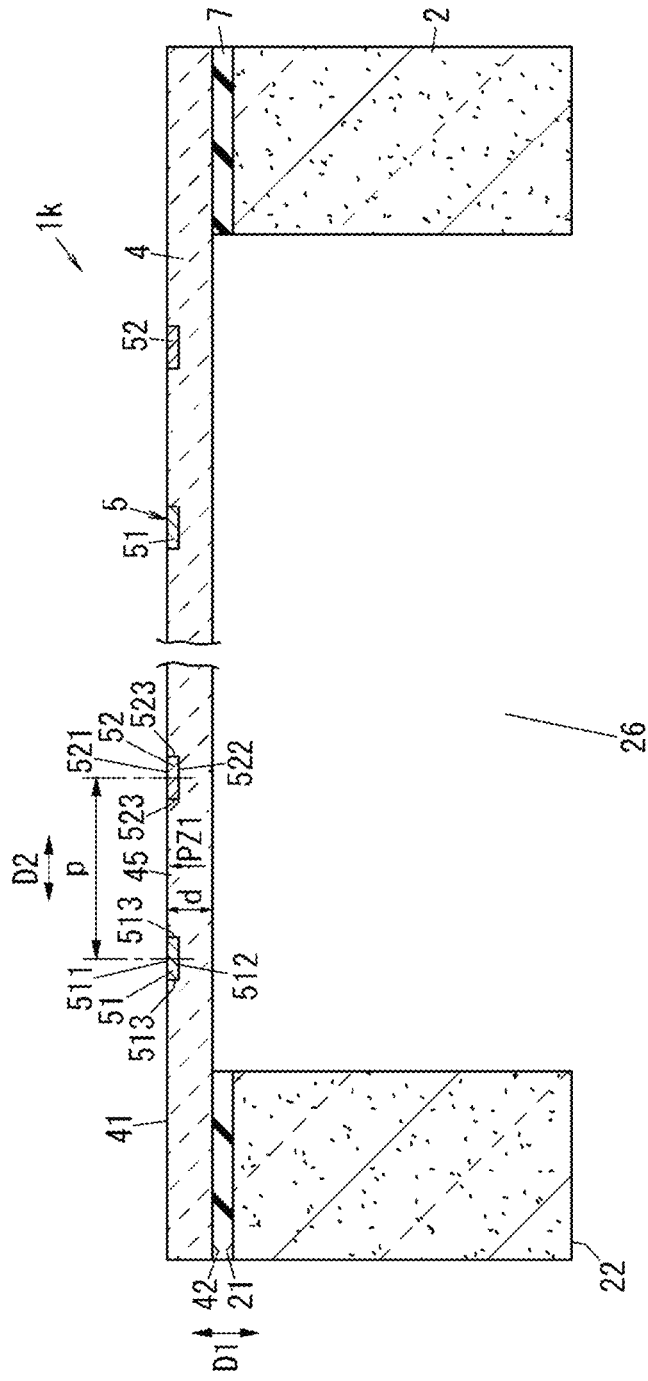
FIG. 26 is a sectional view taken along a line A-A of FIG. 25 and related to the acoustic wave device according to Preferred Embodiment 3 of the present invention.

Hereinafter, an acoustic wave device 1k according to Preferred Embodiment 3 of the present invention will be described with reference to FIGS. 25 and 26. With respect to the acoustic wave device 1k according to Preferred Embodiment 3, the same or similar components to those of the acoustic wave device 1 according to Preferred Embodiment 1 are denoted by the same reference numerals, and a description thereof is omitted.

The acoustic wave device 1k according to Preferred Embodiment 3 does not include the acoustic reflection layer 3 of the acoustic wave device 1 according to Preferred Embodiment 1. In the acoustic wave device 1k according to Preferred Embodiment 3, the piezoelectric layer 4 is provided on the support substrate 2. Here, the support substrate 2 is, for example, a silicon substrate. The piezoelectric layer 4 is bonded to the support substrate 2 with, for example, a silicon oxide film 7 interposed therebetween. The acoustic wave device 1k further includes a cavity 26. The cavity 26 overlaps the acoustic wave resonator 5 in plan view from the thickness direction D1 of the piezoelectric layer 4. The cavity 26 is located immediately below the acoustic wave resonator 5. The acoustic wave resonator 5 includes the first electrode 51 and the second electrode 52 in plan view from the thickness direction D1 of the piezoelectric layer 4, and a portion (defined region 45) between the first electrode 51 and the second electrode 52 in the piezoelectric layer 4 in plan view from the thickness direction D1 of the piezoelectric layer 4. In the acoustic wave device 1k according to Preferred Embodiment 3, the cavity 26 extends through the support substrate 2 and the silicon oxide film 7, and exposes a portion of the piezoelectric layer 4 (a portion of the second main surface 42). In the acoustic wave device 1k according to Preferred Embodiment 3, the acoustic wave resonator 5 does not include the acoustic reflection layer 3 of the acoustic wave device 1 according to Preferred Embodiment 1. The cavity 26 overlaps a portion of each of the first wiring portion 61 and the second wiring portion 62 in plan view from the thickness direction D1 of the piezoelectric layer 4. However, the cavity 26 need not overlap a portion of each of the first wiring portion 61 and the second wiring portion 62 in plan view from the thickness direction D1 of the piezoelectric layer 4.

A thickness of the support substrate 2 is, for example, equal to or greater than about 100 μm and equal to or less than about 500 μm. A thickness of the silicon oxide film 7 is, for example, equal to or greater than about 0.1 μm and equal to or less than about 10 μm. A thickness of the piezoelectric layer 4 is the same or substantially the same as the thickness of the piezoelectric layer 4 of the acoustic wave device 1 according to Preferred Embodiment 1.

In a non-limiting example of a method of manufacturing the acoustic wave device 1k, for example, from a first step to a fifth step are performed after the support substrate 2 is prepared. In the first step, a silicon oxide film is formed on the first main surface 21 of the support substrate 2. In the second step, a piezoelectric substrate from which the piezoelectric layer 4 is formed and the support substrate 2 are bonded to each other with a silicon oxide film interposed therebetween. In the third step, by thinning the piezoelectric substrate, the piezoelectric layer 4 formed from a portion of the piezoelectric substrate is formed. In the fourth step, the first electrode 51, the second electrode 52, the first wiring portion 61, the second wiring portion 62, the first terminal T1, and the second terminal T2 are formed on the piezoelectric layer 4. In the fifth step, the cavity 26 is formed. In the fourth step, the first electrode 51, the second electrode 52, the first wiring portion 61, the second wiring portion 62, the first terminal T1, and the second terminal T2 are formed by utilizing, for example, a photolithography technique, an etching technique, a thin film forming technique, or the like. In the fifth step, a region of the support substrate 2 and the silicon oxide film where the cavity 26 is to be formed is etched by, for example, utilizing a photolithography technique, an etching technique, or the like. In the fifth step, etching is performed using, for example, the silicon oxide film as an etching stopper layer, and then an unnecessary portion of the silicon oxide film is removed by etching to expose a portion of the second main surface 42 of the piezoelectric layer 4. In addition, in the first step to the fifth step, for example, a silicon wafer is used as the support substrate 2, and a piezoelectric wafer is used as the piezoelectric substrate. In the method of manufacturing the acoustic wave device 1k, a wafer including a plurality of acoustic wave devices 1k is diced to obtain a plurality of acoustic wave devices 1k (chips).

The method of manufacturing the acoustic wave device 1k is an example and is not particularly limited. For example, the piezoelectric layer 4 may be formed by utilizing a film forming technique. In this case, the method of manufacturing the acoustic wave device 1k includes a step of forming the piezoelectric layer 4, instead of the second step and the third step. The piezoelectric layer 4 formed by the film forming technique may be, for example, a single crystal or a twin crystal. Examples of the film forming technique include, but are not limited to, a CVD method.

The acoustic wave device 1k according to Preferred Embodiment 3 includes the piezoelectric layer 4, the first electrode 51, and the second electrode 52, the same as or similar to the acoustic wave device 1 according to Preferred Embodiment 1. The first electrode 51 and the second electrode 52 face each other in the direction D2 intersecting the thickness direction D1 of the piezoelectric layer 4. The acoustic wave device 1 utilizes a bulk wave in a thickness-shear primary mode. A material of the piezoelectric layer 4 is, for example, lithium niobate or lithium tantalate. Each of the first electrode 51 and the second electrode is embedded in the piezoelectric layer 4. With the above configuration, in the acoustic wave device 1k according to Preferred Embodiment 3, a Q-value can be increased and a capacitance can be increased, while achieving reducing in size the acoustic wave device 1k in plan view from the thickness direction D1 of the piezoelectric layer 4.

Further, the acoustic wave device 1k according to Preferred Embodiment 3 includes the piezoelectric layer 4, the first electrode 51, and the second electrode 52, the same as or similar to the acoustic wave device 1 according to Preferred Embodiment 1. The first electrode 51 and the second electrode 52 face each other in the direction D2 intersecting the thickness direction D1 of the piezoelectric layer 4. In the acoustic wave device 1, in a section along the thickness direction D1 of the piezoelectric layer 4, d/p is, for example, equal to or less than about 0.5, where p is an inter-centerline distance between the first electrode 51 and the second electrode 52, and d is a thickness of the piezoelectric layer 4. The material of the piezoelectric layer 4 is, for example, lithium niobate or lithium tantalate. Each of the first electrode 51 and the second electrode is embedded in the piezoelectric layer 4. With the above configuration, in the acoustic wave device 1k according to Preferred Embodiment 3, a Q-value can be increased and a capacitance can be increased, while achieving reducing in size the acoustic wave device 1k in plan view from the thickness direction D1 of the piezoelectric layer 4.

Further, the acoustic wave device 1k according to Preferred Embodiment 3 includes the cavity 26. Thus energy of a bulk wave is confined inside the piezoelectric layer 4, and a favorable Q-value can be obtained.

In the acoustic wave device 1k according to Preferred Embodiment 3, the piezoelectric layer 4 is bonded to the support substrate 2 with the silicon oxide film 7 interposed therebetween. However, the silicon oxide film 7 is not necessary. Further, in addition to the silicon oxide film 7, another layer may be laminated between the support substrate 2 and the piezoelectric layer 4. In addition, in the acoustic wave device 1k according to Preferred Embodiment 3, the cavity 26 penetrates the support substrate 2 in a thickness direction thereof but is not limited thereto and may be defined by an internal space of a recessed portion in the first main surface 21 of the support substrate 2, without penetrating the support substrate 2. Further, the acoustic wave resonator 5 may include another film (for example, a dielectric film such as the silicon oxide film 7) laminated on the second main surface 42 of the piezoelectric layer 4. Further, another substrate that overlaps the cavity 26 in plan view may be laminated on a side of the support substrate 2 opposite to a side of the piezoelectric layer 4. A material of the other support substrate is, for example, Si.

Preferred Embodiment 3 described above is merely one of various preferred embodiments of the present invention. Preferred Embodiment 3 described above can be modified in various ways according to design and the like, as long as at least one of the advantageous effects of various preferred embodiments of the present invention can be achieved.

Modified Example of Preferred Embodiment 3

Figure 27:
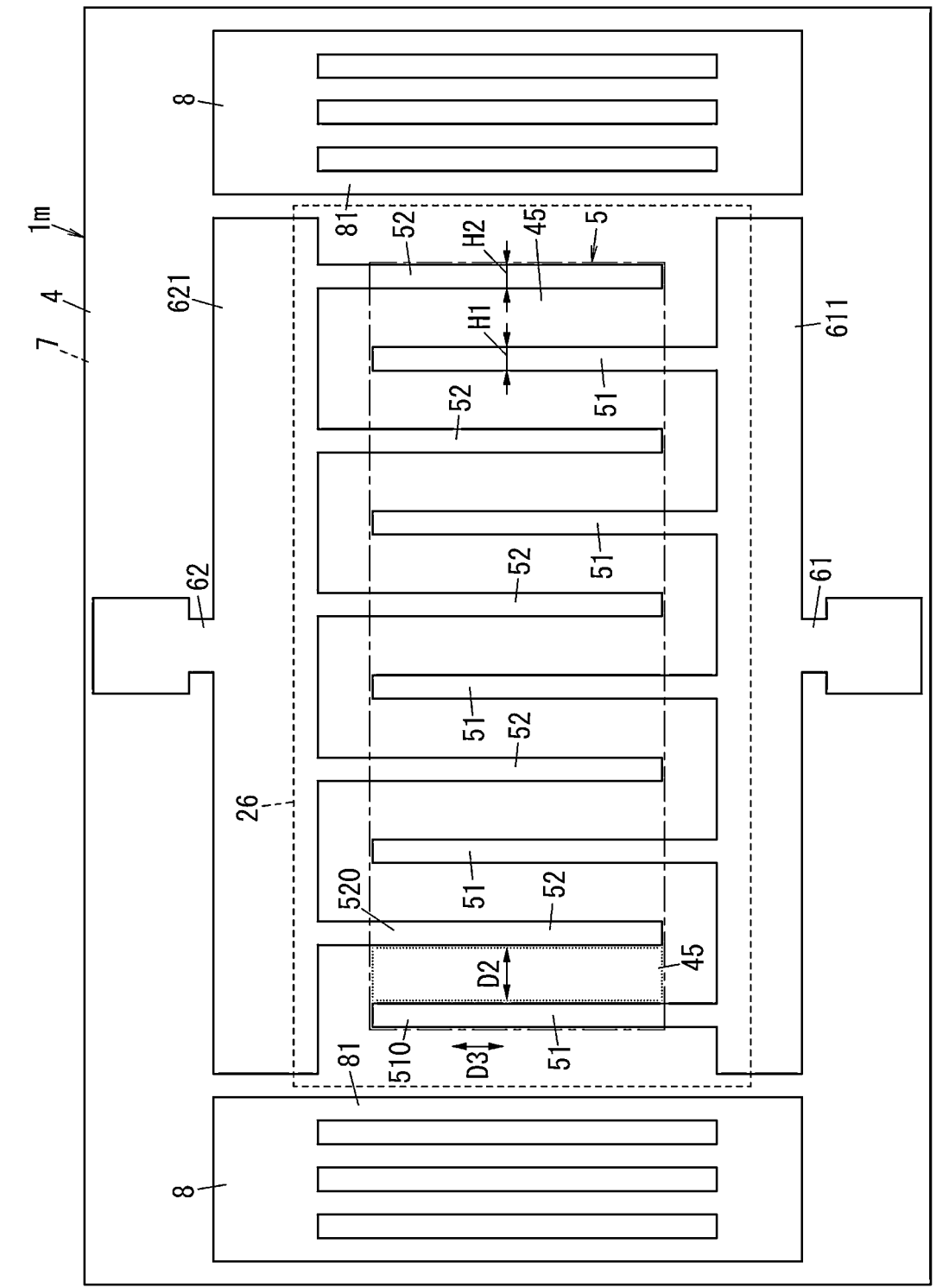
FIG. 27 is a plan view of an acoustic wave device according to a Modified Example of Preferred Embodiment 3 of the present invention.

Hereinafter, an acoustic wave device 1m according to a Modified Example of Preferred Embodiment 3 will be described with reference to FIG. 27. Note that, with respect to the acoustic wave device 1m according to Preferred Embodiment 3, the same or similar components to those of the acoustic wave device 1k according to Preferred Embodiment 3 are denoted by the same reference numerals, and a description thereof is omitted.

The acoustic wave device 1m according to the Modified Example of Preferred Embodiment 3 differs from the acoustic wave device 1k according to Preferred Embodiment 3 in that the two reflectors 8 are further provided as in the acoustic wave device 1h (see FIG. 20) according to Modified Example 8 of Preferred Embodiment 1. A configuration of each reflector 8 is the same as or similar to that of each reflector 8 of the acoustic wave device 1h.

Other Modified Examples

Figure 28:
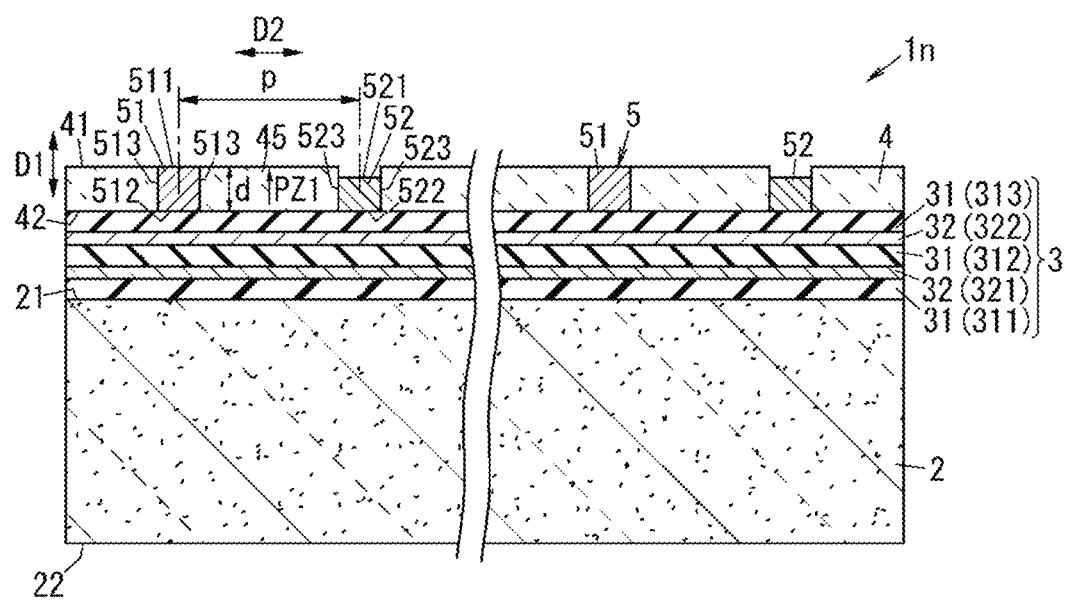
FIG. 28 is a sectional view of an acoustic wave device according to another Modified Example of Preferred Embodiment 3 of the present invention.

For example, as in an acoustic wave device 1n illustrated in FIG. 28, respective sectional shapes of the first electrode 51 and the second electrode 52 may be different from each other. Here, the sectional shape is, for example, a shape in cross section orthogonal or substantially orthogonal to the thickness direction D1 and the second direction D2 of the piezoelectric layer 4. In FIG. 28, the sectional shape of the first electrode 51 is the same or substantially the same as a sectional shape of the acoustic wave device 1b (see FIG. 14), and the cross-sectional shape of the second electrode 52 is the same or substantially the same as a cross-sectional shape of the acoustic wave device 1c (see FIG. 15), but the present invention is not limited to these combinations.

In addition, when an acoustic wave filter is configured as in the acoustic wave device 1a according to Modified Example 1 of the Preferred Embodiment 1, the first electrode 51 and the second electrode 52 may have different shapes, respectively, for each acoustic wave resonator 5. Further, the respective shapes of the first electrode 51 and the second electrode 52 may be different between the acoustic wave resonator 5 defining the series-arm resonator RS1 and the acoustic wave resonator 5 defining the parallel-arm resonator RS2.

Further, instead of the acoustic wave resonator 5 in the acoustic wave device 1a according to Modified Example 1 of Preferred Embodiment 1, the acoustic wave resonator 5 according any one of Modified Examples 2 to 8 of Preferred Embodiment 1, Preferred Embodiment 2, the Modified Examples of Preferred Embodiment 2, Preferred Embodiment 3, the Modified Example of Preferred Embodiment 3, other Modified Examples, and the like, may be provided.

Further, each of the first electrode 51 and the second electrode 52 is not limited to being linear in plan view from the thickness direction D1 of the piezoelectric layer 4. For example, each of the first electrode 51 and the second electrode 52 may have a curved shape or a shape including a linear portion and a curved portion.

In addition, in the acoustic wave device 1k according to Preferred Embodiment 3 and the acoustic wave device 1m according to the Modified Example of the Preferred Embodiment 3, for the first electrode 51 and the second electrode 52, the structure the same as or similar to the first electrode 51 and the second electrode 52 according to any one of Modified Examples 3 to 8 of Preferred Embodiment 1, Preferred Embodiment 2, and the Modified Example of Preferred Embodiment 2 may be provided. For the configuration embedded in the acoustic reflection layer 3 and in contact with the piezoelectric layer 4, for example, a configuration in contact with the second main surface 42 of the piezoelectric layer 4 and exposed by the cavity 26 may be provided.

The following aspects of the present invention are disclosed in the present specification from the above-described preferred embodiments and the like.

An acoustic wave device according to a preferred embodiment of the present invention (1; 1a; 1b; 1c; 1d; 1e; 1f; 1g; 1h; 1k; 1m; 1n) includes a piezoelectric layer (4), a first electrode (51), and a second electrode (52). The first electrode (51) and the second electrode (52) face each other in a direction (D2) intersecting a thickness direction (D1) of the piezoelectric layer (4). The acoustic wave device (1; 1a; 1b; 1c; 1d; 1e; 1f; 1g; 1h; 1k; 1m; 1n) utilizes a bulk wave in a thickness-shear primary mode. A material of the piezoelectric layer (4) is lithium niobate or lithium tantalate. At least a portion of each of the first electrode (51) and the second electrode (52) is embedded in the piezoelectric layer (4).

In the acoustic wave device according to the above-described preferred embodiment (1; 1a; 1b; 1c; 1d; 1e; 1f;

1g; 1h; 1k; 1m; 1n), a Q-value can be increased and a capacitance can be increased while achieving size reduction.

An acoustic wave device according to a preferred embodiment of the present invention (1; 1a; 1b; 1c; 1d; 1e; 1f; 1g; 1h; 1k; 1m; 1n) includes a piezoelectric layer (4), a first electrode (51), and a second electrode (52). The first electrode (51) and the second electrode (52) face each other in a direction (D2) intersecting a thickness direction (D1) of the piezoelectric layer (4). The first electrode (51) and the second electrode (52) are electrodes adjacent to each other. In the acoustic wave device (1; 1a; 1b; 1c; 1d; 1e; 1f; 1g; 1h; 1k; 1m; 1n), in a section along the thickness direction (D1) of the piezoelectric layer (4), d/p is equal to or less than about 0.5, where p is an inter-centerline distance between the first electrode (51) and the second electrode (52), and d is a thickness of the piezoelectric layer (4). A material of the piezoelectric layer (4) is lithium niobate or lithium tantalate. At least a portion of each of the first electrode (51) and the second electrode (52) is embedded in the piezoelectric layer (4).

In the acoustic wave device according to the above-described preferred embodiment (1; 1a; 1b; 1c; 1d; 1e; 1f; 1g; 1h; 1k; 1m; 1n), a Q-value can be increased and a capacitance can be increased while achieving size reduction.

An acoustic wave device according to a preferred embodiment of the present invention (1; 1a; 1b; 1c; 1d; 1e; 1f; 1g; 1h; 1k; 1m; 1n) further includes a support substrate (2) and an acoustic reflection layer (3). The support substrate (2) includes a first main surface (21) and a second main surface (22) facing each other. The acoustic reflection layer (3) is on the first main surface (21) of the support substrate (2). The piezoelectric layer (4) is on the acoustic reflection layer (3). The acoustic reflection layer (3) includes at least one high acoustic impedance layer (32), and at least one low acoustic impedance layer (31). The at least one low acoustic impedance layer (31) has an acoustic impedance lower than that of the at least one high acoustic impedance layer (32).

An acoustic wave device according to a preferred embodiment of the present invention (1k; 1m) further includes a support substrate (2). The support substrate (2) includes a first main surface (21) and a second main surface (22) facing each other. The piezoelectric layer (4) is on the support substrate (2). The acoustic wave device (1k; 1m) further includes a cavity (26). The cavity (26) overlaps an acoustic wave resonator (5) including the first electrode (51), the second electrode (52), and a portion (defined region 45) between the first electrode (51) and the second electrode (52) in the piezoelectric layer (4) in plan view from the thickness direction (D1) of the piezoelectric layer (4). The cavity (26) is on a side of the support substrate (2) with respect to the piezoelectric layer (4).

An acoustic wave device according to a preferred embodiment of the present invention (1i; 1j) includes a piezoelectric layer (4), a first electrode (51), and a second electrode (52). The first electrode (51) and the second electrode (52) face each other in a direction (D2) intersecting a thickness direction (D1) of the piezoelectric layer (4). The acoustic wave device (1; 1a) utilizes a bulk wave in a thickness-shear primary mode. The acoustic wave device (1i; 1j) further includes an acoustic reflection layer (3). A material of the piezoelectric layer (4) is lithium niobate or lithium tantalate. The piezoelectric layer (4) is on the acoustic reflection layer (3). The first electrode (51) and the second electrode (52) are embedded in the acoustic reflection layer (3) and are in contact with the piezoelectric layer (4).

In the acoustic wave device according to the above-described preferred embodiment (1i; 1j), a Q-value can be increased, and a capacitance can be increased, while achieving size reduction.

An acoustic wave device according to a preferred embodiment of the present invention (1i; 1j) includes a piezoelectric layer (4), a first electrode (51), and a second electrode (52). The first electrode (51) and the second electrode (52) face each other in a direction (D2) intersecting a thickness direction (D1) of the piezoelectric layer (4). In the acoustic wave device (1i; 1j), in a section along the thickness direction (D1) of the piezoelectric layer (4), d/p is equal to or less than about 0.5, where p is an inter-centerline distance between the first electrode (51) and the second electrode (52), and d is a thickness of the piezoelectric layer (4). The acoustic wave device (1i; 1j) further includes an acoustic reflection layer (3). A material of the piezoelectric layer (4) is lithium niobate or lithium tantalate. The piezoelectric layer (4) is on the acoustic reflection layer (3). The first electrode (51) and the second electrode (52) are embedded in the acoustic reflection layer (3) and are in contact with the piezoelectric layer (4).

In the acoustic wave device according to the above-described preferred embodiment (1i; 1j), a Q-value can be increased, and a capacitance can be increased, while achieving size reduction.

In an acoustic wave device according to a preferred embodiment of the present invention (1; 1a; 1b; 1c; 1d; 1e; 1f; 1g; 1h; 1k; 1m; 1n), d/p is equal to or less than about 0.24.

In the acoustic wave device according to the above-described preferred embodiment ((1; 1a; 1b; 1c; 1d; 1e; 1f; 1g; 1h; 1k; 1m; 1n), it is possible to increase a fractional bandwidth.

In an acoustic wave device according to a preferred embodiment of the present invention (1; 1a; 1b; 1c; 1d; 1e; 1f; 1g; 1h; 1k; 1m; 1n), the first electrode (51) and the second electrode (52) are adjacent to each other. The first electrode (51) includes a first electrode main portion (510), and the second electrode (52) includes a second electrode main portion (520). The first electrode main portion (510) intersects the second electrode (52) in the direction in which the first electrode (51) and the second electrode (52) face each other. The second electrode (52) intersects the first electrode (51) in the direction in which the first electrode (51) and the second electrode (52) face each other. The piezoelectric layer (4) includes a defined region (45). The defined region (45) intersects both the first electrode (51) and the second electrode (52) in the direction (D2) in which the first electrode (51) and the second electrode (52) face each other in the piezoelectric layer (4), and is located between the first electrode (51) and the second electrode (52) in plan view from the thickness direction (D1) of the piezoelectric layer (4). The acoustic wave device (1; 1a; 1b; 1c; 1d; 1e; 1f; 1g; 1h; 1k; 1m; 1n) satisfies the following condition. The condition is MR≤1.75×(d/p)+0.075. Here, S1 is an area of the first electrode main portion (510) in plan view from the thickness direction (D1) of the piezoelectric layer (4). S2 is an area of the second electrode main portion (520) in plan view from the thickness direction (D1) of the piezoelectric layer (4). S0 is an area of the defined region (45) in plan view from the thickness direction (D1) of the piezoelectric layer (4). MR is a structural parameter defined by (S1+S2)/(S1+S2+S0).

In the acoustic wave device according to the above-described preferred embodiment (1; 1a; 1b; 1c; 1d; 1e; 1f; 1g; 1h; 1k; 1m; 1n), it is possible to reduce or prevent a spurious level in a band.

In an acoustic wave device according to a preferred embodiment of the present invention (1b; 1d), the first electrode (51) penetrates the piezoelectric layer (4).

In the acoustic wave device according to the above-described preferred embodiment (1b; 1d), the capacitance can be increased as compared with a case where the first electrode (51) does not penetrate the piezoelectric layer (4).

In an acoustic wave device according to a preferred embodiment of the present invention (1d; 1g; 1j), the first electrode (51) includes a portion protruding from the piezoelectric layer (4).

In the acoustic wave device according to the above-described preferred embodiment (1d; 1g; 1j), heat dissipation can be improved.

In an acoustic wave device according to a preferred embodiment of the present invention (1d), the piezoelectric layer (4) includes a first main surface (41) and a second main surface (42) facing each other in the thickness direction (D1). The first electrode (51) includes a penetrating portion (51A), a first protruding portion (51B), and a second protruding portion (51C). The penetrating portion (51A) penetrates the piezoelectric layer (4). The first protruding portion (51B) is connected to the penetrating portion (51A), and protrudes from the first main surface (41) of the piezoelectric layer (4). The second protruding portion (51C) is connected to the penetrating portion (51A) and protrudes from the second main surface (42) of the piezoelectric layer (4).

In the acoustic wave device according to the above-described preferred embodiment (1d), the capacitance can be further increased.

In an acoustic wave device according to a preferred embodiment of the present invention (1d), a protruding dimension (HB1) of the first protruding portion (51B) is greater than a protruding dimension (HC1) of the second protruding portion (51C).

In the acoustic wave device according to the above-described preferred embodiment (1d), heat dissipation can be improved.

In an acoustic wave device according to a preferred embodiment of the present invention (1g), the first electrode (51) includes a plurality of conductor portions (516, 517, 518) in the thickness direction (D1) of the piezoelectric layer (4).

In the acoustic wave device according to the above-described preferred embodiment (1g), the capacitance can be further increased.

In an acoustic wave device according to a preferred embodiment of the present invention (1n), the first electrode (51) and the second electrode (52) have respective sectional shapes different from each other.

In an acoustic wave device according to a preferred embodiment of the present invention (1; 1a; 1b; 1c; 1d; 1e; 1f; 1g; 1h; 1i; 1j; 1k; 1m; 1n), the first electrode (51) includes a plurality of first electrodes (51) and the second electrode (52) includes a plurality of second electrodes (52). The first electrodes (51) and the second electrodes (52) are alternately provided one by one. The acoustic wave device (1; 1a; 1b; 1c; 1d; 1e; 1f;1g; 1h; 1i; 1j; 1k; 1m; 1n), further includes a first wiring portion (61) and a second wiring portion (62). The plurality of first electrodes (51) is connected to the first wiring portion (61). The plurality of second electrodes (52) is connected to the second wiring portion (62).

In the acoustic wave device according to the above-described (1; 1a; 1b; 1c; 1d; 1e; 1f; 1g; 1h; 1i; 1j; 1k; 1m; 1n), the capacitance can be further increased.

An acoustic wave device according to a preferred embodiment of the present invention (1a), is an acoustic wave filter including a plurality of acoustic wave resonators (5). Each of the acoustic wave resonators (5) includes the first electrode (51) and the second electrode (52). The piezoelectric layer (4) is shared by the acoustic wave resonators (5).

The acoustic wave device according to the above-described preferred embodiment (1a) can support high frequency.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:

a piezoelectric layer; and a first electrode and a second electrode facing each other in a direction intersecting a thickness direction of the piezoelectric layer; wherein the acoustic wave device utilizes a bulk wave in a thickness-shear primary mode;

a material of the piezoelectric layer is lithium niobate or lithium tantalate;

at least a portion of each of the first electrode and the second electrode is embedded in the piezoelectric layer;

about $0.048 \leq d/p \leq $ about $0.072$, where in a cross-section along the thickness direction of the piezoelectric layer, an inter-centerline distance between the first electrode and the second electrode is denoted as p, and a thickness of the piezoelectric layer is denoted as d;

the first electrode and the second electrode are adjacent to each other;

the first electrode includes a first electrode main portion intersecting the second electrode in the direction in which the first electrode and the second electrode face each other;

the second electrode includes a second electrode main portion intersecting the first electrode in the direction in which the first electrode and the second electrode face each other;

the piezoelectric layer includes a defined region in the piezoelectric layer which intersects both the first electrode and the second electrode in the direction in which the first electrode and the second electrode face each other and is between the first electrode and the second electrode in a plan view from the thickness direction of the piezoelectric layer; and in a plan view from the thickness direction of the piezoelectric layer, when an area of the first electrode main portion is denoted as S1, an area of the second electrode main portion is denoted as S2, an area of the defined region is denotes as S0, and a structural parameter defined by $(S1+S2)/(S1+S2+S0)$ is denoted as MR, the acoustic wave device satisfies a condition of $MR \leq 1.75 \times (d/p)+0.075$.

2. The acoustic wave device according to claim 1, further comprising:

a support substrate including a first main surface and a second main surface facing each other; and an acoustic reflection layer on the first main surface of the support substrate; wherein the piezoelectric layer is on the acoustic reflection layer; and the acoustic reflection layer includes:
   at least one high acoustic impedance layer; and
   at least one low acoustic impedance layer with an acoustic impedance lower than an acoustic impedance of the at least one high acoustic impedance layer.

3. The acoustic wave device according to claim 1, further comprising:
   a support substrate including a first main surface and a second main surface facing each other; wherein
   the piezoelectric layer is on the support substrate;
   the acoustic wave device further includes a cavity;
   the cavity overlaps an acoustic wave resonator including the first electrode, the second electrode, and a portion between the first electrode and the second electrode in the piezoelectric layer in a plan view from the thickness direction of the piezoelectric layer; and
   the cavity is on a side of the support substrate with respect to the piezoelectric layer.

4. The acoustic wave device according to claim 1, wherein the first electrode penetrates the piezoelectric layer.

5. The acoustic wave device according to claim 1, wherein the first electrode includes a portion protruding from the piezoelectric layer.

6. The acoustic wave device according to claim 1, wherein
   the piezoelectric layer includes a first main surface and a second main surface facing each other in the thickness direction; and
   the first electrode includes:
      a penetrating portion penetrating the piezoelectric layer;
      a first protruding portion connected to the penetrating portion and protruding from the first main surface of the piezoelectric layer; and
      a second protruding portion connected to the penetrating portion and protruding from the second main surface of the piezoelectric layer.

7. The acoustic wave device according to claim 6, wherein a protruding dimension of the first protruding portion is greater than a protruding dimension of the second protruding portion.

8. The acoustic wave device according to claim 1, wherein the first electrode includes conductor portions in the thickness direction of the piezoelectric layer.

9. The acoustic wave device according to claim 1, wherein the first electrode and the second electrode have respective cross-sectional shapes different from each other.

10. The acoustic wave device according to claim 1, wherein
   a plurality of the first electrodes and a plurality of the second electrodes are provided;
   the plurality of first electrodes and the plurality of second electrodes are alternately provided one by one; and
   the acoustic wave device further includes:
      a first wiring portion connected to the plurality of first electrodes; and
      a second wiring portion connected to the plurality of second electrodes.

11. The acoustic wave device according to claim 1, wherein
   the acoustic wave device is an acoustic wave filter including a plurality of acoustic wave resonators;
   each of the plurality of acoustic wave resonators includes the first electrode and the second electrode; and
   the piezoelectric layer is shared by the plurality of acoustic wave resonators.

12. An acoustic wave device, comprising:
   a piezoelectric layer; and
   a first electrode and a second electrode facing each other in a direction intersecting a thickness direction of the piezoelectric layer; wherein
   the first electrode and the second electrode are adjacent to each other;
   about $0.048 \leq d/p \leq$ about 0.072, where in a cross-section along the thickness direction of the piezoelectric layer, an inter-centerline distance between the first electrode and the second electrode is denoted as p, and a thickness of the piezoelectric layer is denoted as d;
   a material of the piezoelectric layer is lithium niobate or lithium tantalate;
   at least a portion of each of the first electrode and the second electrode is embedded in the piezoelectric layer;
   the first electrode includes a first electrode main portion intersecting the second electrode in the direction in which the first electrode and the second electrode face each other;
   the second electrode includes a second electrode main portion intersecting the first electrode in the direction in which the first electrode and the second electrode face each other;
   the piezoelectric layer includes a defined region in the piezoelectric layer which intersects both the first electrode and the second electrode in the direction in which the first electrode and the second electrode face each other and is between the first electrode and the second electrode in a plan view from the thickness direction of the piezoelectric layer; and
   in a plan view from the thickness direction of the piezoelectric layer, when an area of the first electrode main portion is denoted as S1, an area of the second electrode main portion is denoted as S2, an area of the defined region is denotes as S0, and a structural parameter defined by (S1+S2)/(S1+S2+S0) is denoted as MR, the acoustic wave device satisfies a condition of $MR \leq 1.75 \times (d/p) + 0.075$.

13. The acoustic wave device according to claim 12, further comprising:
   a support substrate including a first main surface and a second main surface facing each other; and
   an acoustic reflection layer on the first main surface of the support substrate; wherein
   the piezoelectric layer is on the acoustic reflection layer; and
   the acoustic reflection layer includes:
      at least one high acoustic impedance layer; and
      at least one low acoustic impedance layer with an acoustic impedance lower than an acoustic impedance of the at least one high acoustic impedance layer.

14. The acoustic wave device according to claim 12, further comprising:
   a support substrate including a first main surface and a second main surface facing each other; wherein
   the piezoelectric layer is on the support substrate;
   the acoustic wave device further includes a cavity;
   the cavity overlaps an acoustic wave resonator including the first electrode, the second electrode, and a portion between the first electrode and the second electrode in the piezoelectric layer in a plan view from the thickness direction of the piezoelectric layer; and the cavity is on a side of the support substrate with respect to the piezoelectric layer.

* * * * *